US011220738B2

(12) United States Patent
Mohri et al.

(10) Patent No.: US 11,220,738 B2
(45) Date of Patent: Jan. 11, 2022

(54) BI-LAYER THIN FILM EXHIBITING PSEUDO ELASTICITY AND SHAPE MEMORY EFFECT

(71) Applicants: Maryam Mohri, Tehran (IR); Mahmoud Nili Ahmadabadi, Tehran (IR)

(72) Inventors: Maryam Mohri, Tehran (IR); Mahmoud Nili Ahmadabadi, Tehran (IR)

(*) Notice: Subject to any disclaimer, the term of this patent is extended or adjusted under 35 U.S.C. 154(b) by 166 days.

(21) Appl. No.: 16/199,158

(22) Filed: Nov. 24, 2018

(65) Prior Publication Data
US 2019/0093209 A1 Mar. 28, 2019

Related U.S. Application Data

(63) Continuation-in-part of application No. 15/707,033, filed on Sep. 18, 2017, now abandoned.

(51) Int. Cl.
| | |
|---|---|
| *C22C 14/00* | (2006.01) |
| *C22C 19/03* | (2006.01) |
| *C22F 1/18* | (2006.01) |
| *C22F 1/00* | (2006.01) |
| *C22F 1/10* | (2006.01) |
| *C23C 14/20* | (2006.01) |
| *C23C 14/34* | (2006.01) |
| *C23C 14/35* | (2006.01) |

(Continued)

(52) U.S. Cl.
CPC .............. *C23C 14/20* (2013.01); *C22C 14/00* (2013.01); *C22C 19/03* (2013.01); *C22F 1/006* (2013.01); *C22F 1/10* (2013.01); *C22F 1/183* (2013.01); *C23C 14/34* (2013.01); *C23C 14/3414* (2013.01); *C23C 14/35* (2013.01); *C23C 14/5806* (2013.01); *F03G 7/065* (2013.01)

(58) Field of Classification Search
CPC combination set(s) only.
See application file for complete search history.

(56) References Cited

PUBLICATIONS

Mohri et al.,"On the Super-Elastic and Phase Transformation of a Novel Ni-Rich/NiTiCu Bi-Layer Thin Film," Advanced Engineering Materials 2015, 17, No. 6, p. 856-865 (Year: 2015).*

(Continued)

*Primary Examiner* — Patricia L. Hailey
*Assistant Examiner* — Christopher D. Moody
(74) *Attorney, Agent, or Firm* — Summit Patent Group

(57) ABSTRACT

A method for fabricating a bi-layer thin film is provided. A first alloy is deposited onto a substrate using a first alloy target to form a first layer of the bi-layer thin film. The first layer may comprise greater than 50 atomic % titanium (Ti) and/or less than 50 atomic % nickel (Ni). The first alloy may be deposited onto the substrate at a first temperature (e.g., room temperature). The substrate may be made of a polymer material, such as poly (4,4'-oxydiphenylene-pyromellitimide) (e.g., Kapton™). A second alloy is deposited onto the first layer using a second alloy target to form a second layer of the bi-layer thin film. The second layer may comprise greater 50 atomic % nickel and/or less than 50 atomic % titanium. The second alloy may be deposited onto the first layer at a second temperature (e.g., room temperature). The bi-layer thin film may exhibit pseudo elasticity and shape memory effect (SME).

9 Claims, 18 Drawing Sheets

(51) Int. Cl.
   *C23C 14/58* (2006.01)
   *F03G 7/06* (2006.01)

(56) References Cited

PUBLICATIONS

Mohri et al., "Evaluation of structure and mechanical properties of Ni-rich NiTi/Kapton composite film," May 13, 2016, Materials Science and Engineering A 668, p. 13-19 (Year: 2016).*

Mohri and Ahmadabadi, "Functionally Graded Shape-Memory and Pseudoelastic Response in Ni-Rich/Ti-Rich and Vice Versa NiTi Multilayer Thin Films Deposited on Si(111)," Feb. 27, 2015, JOM, vol. 67, No. 7, p. 1585-1593 (Year: 2015).*

Mohri et al., "Crystallization study of amorphous sputtered NiTi bi-layerthin film," Mar. 26, 2015, Materials Characterization 103, p. 75-80 (Year: 2015).*

Mohri and Ahmadabadi, "Phase transformation and structure of functionally gradedNi-Ti bi-layer thin films with two-way shape memory effect", Mar. 19, 2015, Sensors and Actuators A 228, p. 151-158 (Year: 2015).*

Mohri et al., "Microstructure and mechanical behavior of a shape memory Ni—Ti bi-layer thin film," Apr. 2, 2015, Thin Solid Films 583, p. 245-254 (Year: 2015).*

Mohri et al., "Microstructural study and simulation of intrinsic two-way shape memory behavior of functionally graded Ni-rich/NiTiCu thin film," Dec. 1, 2017, Materials Characterization 135, p. 317-324 (Year: 2018).*

Khaleghi et al. "Functionally-Graded Shape Memory Alloy by Diffusion Annealing of Palladium-Coated NiTi Plates," Met. Mater. Int. (Year: 2017).*

Ahmadabadi and Mohri, "Evaluation of two-way shape memory effect in bi-layer NiTi Thin Film," METAL, Jun. 3-5, 2015, Brno, Czech Republic, EU. (Year: 2015).*

Tozzi et al., "Laboratory Vacuum Pump Buyers' Guide", Labcompare. com, https://www.labcompare.com/10-Featured-Articles/116935-Laboratory-Vacuum-Pump-Buyers-Guide/?ctid=1&cid=556 (Retrieved Feb. 12, 2020) (Year: 2012).*

\* cited by examiner

| Sample | T (°C) | | | | | | |
|---|---|---|---|---|---|---|---|
| | $A_f$ | $A_s$ | $M_s$ | $M_f$ | $R_s$ | $R_f$ | $\Delta T = A_f - M_s$ |
| Bi-layer | 25 | 14 | 26 | 16 | 36 | 32 | ≈1 |

675

BI-LAYER THIN FILM EXHIBITING PSEUDO ELASTICITY AND SHAPE MEMORY EFFECT

RELATED APPLICATIONS

This is a continuation-in-part of U.S. application Ser. No. 15/707,033, filed Sep. 18, 2017, which is incorporated herein by reference in its entirety.

BACKGROUND

Thin films are used in a variety of applications, such as micro-actuators, micro-electromechanical systems (MEMS), etc. Production of thin films having superior properties (e.g., shape memory effect (SME), two way SME behaviors, pseudo elasticity, super elasticity, temperature hysteresis, etc.), lower material costs, etc. is a challenge but is imperative for improving many of the applications. Further, development of thin films may require complex processes (e.g., complex heat treatment processes and/or training processes). Improvements in SME, two way SME behaviors, pseudo elasticity, temperature hysteresis, reducing a level of complexity of developing thin films, etc. may result in more effective performance in the applications and/or a more efficient implementation of the applications.

SUMMARY

This summary is provided to introduce a selection of concepts in a simplified form that are further described below in the detailed description. This summary is not intended to identify key factors or essential features of the claimed subject matter, nor is it intended to be used to limit the scope of the claimed subject matter.

In an example, a method for fabricating a bi-layer thin film is provided. A first alloy may be deposited onto a substrate using a first alloy target to form a first layer of the bi-layer thin film. The substrate may be made of a polymer material, such as poly (4,4'-oxydiphenylene-pyromellitimide) (e.g., Kapton™). The first alloy may be deposited onto the substrate at a first temperature. The first temperature may be between 20° C. and 25° C. (e.g., room temperature). A second alloy may be deposited onto the first layer to form a second layer of the bi-layer thin film. The second alloy may be deposited onto the first layer at a second temperature. The second temperature may be between 20° C. and 25° C. (e.g., room temperature). The bi-layer thin film may exhibit pseudo elasticity and/or shape memory effect (SME).

In another example, a bi-layer thin film is provided. The bi-layer thin film comprises a first layer, a second layer and/or a substrate. The first layer may comprise greater than 50 atomic % nickel (Ni) (e.g., the nickel of the first layer may be present at 50.01 to 50.99 atomic %) and/or less than 50 atomic % titanium (Ti) (e.g., the titanium of the first layer may be present at 49.01 to 49.99 atomic %). The second layer may comprise greater than 50 atomic % titanium (e.g., the titanium of the second layer may be present at 50.01 to 51.49 atomic %) and/or less than 50 atomic % nickel (e.g., the nickel of the second layer may be present at 48.51 to 49.99 atomic %). The substrate may comprise a polymer material, such as poly (4,4'-oxydiphenylene-pyromellitimide) (e.g., Kapton™). The bi-layer thin film may exhibit pseudo elasticity and/or SME.

In another example, a method for fabricating a bi-layer thin film is provided. A first alloy may be deposited onto a substrate using a first alloy target to form a first layer of the bi-layer thin film. The substrate may be made of a polymer material, such as poly (4,4'-oxydiphenylene-pyromellitimide) (e.g., Kapton™). The first alloy may be deposited onto the substrate at a first temperature. The first temperature may be between 20° C. and 25° C. (e.g., room temperature). The first layer may comprise greater than 50 atomic % titanium and/or less than 50 atomic % nickel. A second alloy may be deposited onto the first layer to form a second layer of the bi-layer thin film. The second alloy may be deposited onto the first layer at a second temperature. The second temperature may be between 20° C. and 25° C. (e.g., room temperature). The second layer may comprise greater than 50 atomic % nickel and/or less than 50 atomic % titanium. The bi-layer thin film may exhibit pseudo elasticity and/or SME.

DESCRIPTION OF THE DRAWINGS

While the techniques presented herein may be embodied in alternative forms, the particular embodiments illustrated in the drawings are only a few examples that are supplemental of the description provided herein. These embodiments are not to be interpreted in a limiting manner, such as limiting the claims appended hereto.

DETAILED DESCRIPTION

Figure 1:
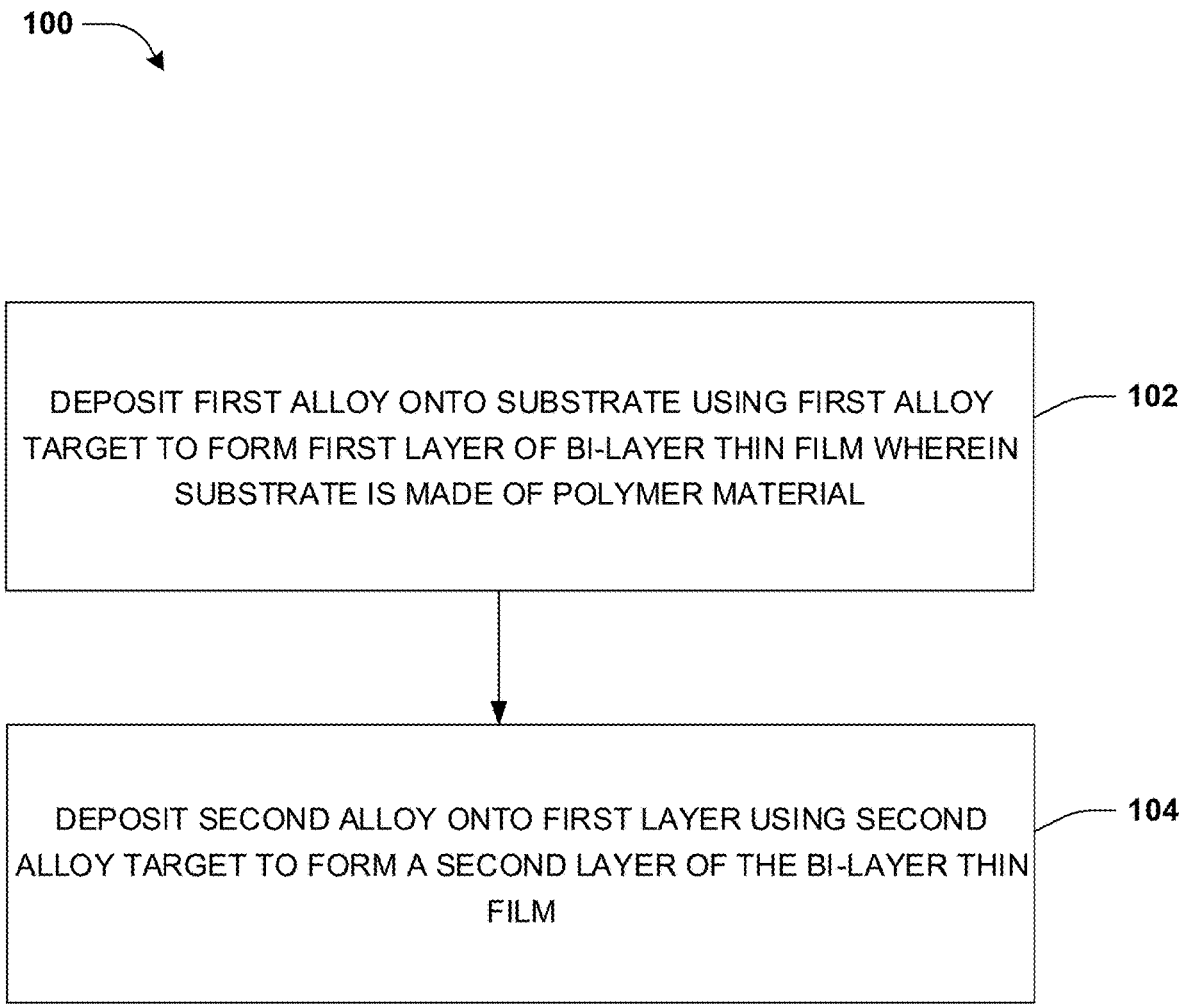
FIG. 1 is an illustration of an exemplary method for fabricating a bi-layer thin film.

The following subject matter may be embodied in a variety of different forms, such as methods, compositions, materials, and/or systems. Accordingly, this subject matter is not intended to be construed as limited to any example embodiments set forth herein. Rather, example embodiments are provided merely to be illustrative.

All numerical values within the detailed description and the claims herein are modified by "about" or "approximately" the indicated value, and take into account experimental error and variations that would be expected by a person having ordinary skill in the art.

Where a range of values is provided, it is understood that each intervening value, to the tenth of the unit of the lower limit unless the context clearly dictates otherwise, between the upper and lower limit of that range and any other stated or intervening value in that stated range is encompassed within the disclosure. Ranges from any lower limit to any upper limit are contemplated. The upper and lower limits of these smaller ranges which may independently be included in the smaller ranges is also encompassed within the disclosure, subject to any specifically excluded limit in the stated range. Where the stated range includes one or both of the limits, ranges excluding either both of those included limits are also included in the disclosure.

Although any methods and materials similar or equivalent to those described herein can also be used in the practice or testing of the present disclosure, the preferred methods and materials are now described. All publications mentioned herein are incorporated herein by reference to disclose and described the methods and/or materials in connection with which the publications are cited.

It must be noted that as used herein and in the appended claims, the singular forms "a", "and", and "the" include plural references unless the context clearly dictates otherwise.

Unless otherwise defined, all technical and scientific terms used herein have the same meaning as commonly understood by one of ordinary skill in the art to which this disclosure belongs. The terminology used in the description of the disclosure herein is for describing particular embodiments only and is not intended to be limiting of the disclosure. All publications, patent applications, patents, figures and other references mentioned herein are expressly incorporated by reference in their entirety.

1. Bi-Layer Thin Film Composition

The present disclosure provides bi-layer thin film compositions. In some examples, one or more of the bi-layer thin film compositions of the present disclosure provide improvements to one or more of the following properties: pseudo elasticity (and/or super elasticity), shape memory effect (SME), temperature hysteresis (e.g., thermal hysteresis and/or transformation hysteresis), etc.

A bi-layer thin film may be provided, comprising a first layer and/or a second layer. For example, the first layer may comprise nickel (Ni) and/or titanium (Ti). The first layer may be an Ni-rich layer. For example, the nickel of the first layer may be present at greater than 50 atomic %. Alternatively and/or additionally, the titanium of the first layer may be present at less than 50 atomic %. In some examples, atomic percentages are based upon a total number of atoms of the first layer (e.g., an atomic percentage of the nickel of the first layer may be indicative of a percentage of atoms that are nickel, relative to the total number of atoms of the first layer).

The nickel of the first layer may be about 50.8 atomic %. Alternatively and/or additionally, the nickel of the first layer may be present at a percentage within a first range (e.g., wherein the first range is one of: about 50.01 to 50.99 atomic %, preferably about 50.50 to 50.99 atomic %, more preferably about 50.65 to 50.95 atomic %, even more preferably about 50.7 to 50.9 atomic %, or especially preferred about 50.75 to 50.85 atomic %). The titanium of the first layer may be about 49.2 atomic %. Alternatively and/or additionally, the titanium of the first layer may be present at a percentage within a second range (e.g., wherein the second range is one of: about 49.01 to 49.99 atomic %, preferably about 49.01 to 49.50 atomic %, more preferably about 49.05 to 49.35 atomic %, even more preferably about 49.1 to 49.3 atomic %, or especially preferred about 49.15 to 49.25 atomic %).

In some examples, the second layer may comprise titanium and/or nickel. The second layer may be a Ti-rich layer. For example, the titanium of the second layer may be present at greater than 50 atomic %. Alternatively and/or additionally, the nickel of the second layer may be present at less than 50 atomic %. The titanium of the second layer may be about 51 atomic %. Alternatively and/or additionally, the titanium of the second layer may be present at a percentage within a third range (e.g., wherein the third range is one of: about 50.01 to 51.50 atomic %, preferably about 50.5 to 51.5 atomic %, more preferably about 50.7 to 51.3 atomic %, even more preferably 50.9 to 51.1 atomic %, or especially preferred about 50.95 to 51.05 atomic %). The nickel of the second layer may be about 49 atomic %. Alternatively and/or additionally, the nickel of the second layer may be present at a percentage within a fourth range (e.g., wherein the fourth range is one of: about 48.50 to 49.99 atomic %, preferably about 48.5 to 49.5 atomic %, more preferably about 48.7 to 49.3 atomic %, even more preferably about 48.9 to 49.1 atomic %, or especially preferred about 48.95 to 49.05 atomic %).

Alternatively and/or additionally, the second layer may (further) comprise copper (Cu). For example, the copper of the second layer may be present at less than or equal to 5 atomic %. For example, the copper of the second layer may be present at a percentage within a fifth range (e.g., wherein the fifth range is about 0.1 to 5.0 atomic %). Alternatively and/or additionally, in an instance where the second layer comprises copper, the nickel of the second layer may be present at a percentage within a sixth range (e.g., wherein the sixth range is about 43.50 to 44.99 atomic %). The copper of the second layer may constitute a substantial balance of the second layer. Alternatively and/or additionally, a combination of the copper of the second layer and/or one or more other elements may constitute the substantial balance of the second layer.

In some examples, the bi-layer thin film may comprise a substrate. For example, the substrate may be made of a polymer material. The substrate may be a polyimide. For example, the substrate may be made of poly (4,4'-oxydiphenylene-pyromellitimide) (e.g., Kapton™) and/or a different type of polyimide and/or polymer material. Alternatively and/or additionally, the substrate may be made of silicone (Si). For example, the substrate may be made of a crystalline silicone (e.g., Si (111)).

In some examples, the bi-layer thin film may have a first structure associated with a first sequence of layers. For example, in the first structure of the bi-layer thin film, the bi-layer thin film may comprise the substrate, the first layer on top of the substrate (e.g., the first layer may be adjacent to the substrate) and/or the second layer on top of the first layer (e.g., the second layer may be adjacent to the first layer). Alternatively and/or additionally, the bi-layer thin film may have a second structure associated with a second sequence of layers. For example, in the second structure of the bi-layer thin film, the bi-layer thin film may comprise the substrate, the second layer on top of the substrate (e.g., the second layer may be adjacent to the substrate) and/or the first layer on top of the second layer (e.g., the first layer may be adjacent to the second layer).

2. Fabricating Bi-Layer Thin Film

FIG. 1 illustrates a method 100 for fabricating the bi-layer thin film. At 102, a first alloy may be deposited onto the substrate using a first alloy target to form the first layer of the bi-layer thin film. In some examples, the depositing the first alloy onto the substrate may be performed at a first temperature. For example, the first temperature may be between 20° C. and 25° C. (e.g., room temperature). Alternatively and/or additionally, the first temperature may be different than room temperature and/or may not be between 20° C. and 25° C.

At 104, a second alloy may be deposited onto the first layer of the bi-layer thin film to form the second layer of the bi-layer thin film. In some examples, the depositing the second alloy onto the first layer may be performed at a second temperature. For example, the second temperature may be between 20° C. and 25° C. (e.g., room temperature). Alternatively and/or additionally, the second temperature may be different than room temperature and/or may not be between 20° C. and 25° C. In some examples, the second temperature may be approximately equal to the first temperature. Alternatively and/or additionally, the second temperature may be different than the first temperature.

In some examples, the depositing the first alloy onto the substrate may be performed by performing a first sputtering process using the first alloy target. For example, the first sputtering process may comprise the first alloy being sputtered onto the substrate from the first alloy target. Alternatively and/or additionally, prior to the depositing the first alloy onto the substrate using the first alloy target, the first alloy target may be prepared. For example, vacuum arc re-melting (VAR) may be performed using a third alloy to produce the first alloy target. For example, the third alloy may be forged and/or annealed to produce the first alloy target.

In some examples, a first composition of the third alloy and/or the first alloy target may be similar to a second composition of the first layer. Alternatively and/or additionally, the first composition of the third alloy and/or the first alloy target may be different than the second composition of the first layer. For example, nickel of the first alloy target may be present at a percentage within the first range and/or may be about 50.8 atomic %. Alternatively and/or additionally, the nickel of the first alloy target may be present at a percentage outside of the first range.

Alternatively and/or additionally, titanium of the first alloy target may be present at a percentage within the second range and/or may be about 49.2 atomic %. Alternatively and/or additionally, the titanium of the first alloy target may be present at a percentage outside of the second range. For example, during the first sputtering process and/or during the depositing the first alloy onto the substrate using the first alloy target, there may be a loss of titanium of the first alloy while the first alloy is sputtered onto the substrate from the first alloy target (e.g., the loss of titanium may be about 4.0 to 4.5 atomic %, which may be due to an angular sputtering distribution associated with the titanium of the first alloy being sputtered onto the substrate). Accordingly, an atomic percentage of the titanium of the first alloy target (and/or the third alloy) may be greater than an atomic percentage of the titanium of the first layer in order to take into account the loss of the titanium of the first alloy during the first sputtering process.

In some examples, the first sputtering process may be a first direct current (DC) magnetron sputtering process. Alternatively and/or additionally, the first sputtering process may be a first radio frequency (RF) magnetron sputtering process. In some examples, during the depositing the first alloy onto the substrate, an object upon which the substrate is mounted and/or held may be moved and/or rotated such that a first uniform distribution of composition (e.g., film uniformity) associated with the first layer is achieved. The object may be a substrate holder. The object may be rotated and/or moved continuously.

Alternatively and/or additionally, the depositing the first alloy onto the substrate may be performed using a first base pressure. For example, the first base pressure may be less than $10^{-7}$ millibars (and/or a different amount of pressure). Alternatively and/or additionally, the depositing the first alloy onto the substrate may be performed using a first argon pressure (e.g., "$P_{Ar}$"). The first argon pressure may be about $3\times10^{-3}$ millibars. Alternatively and/or additionally, the first argon pressure may be between $2\times10^{-3}$ millibars and $4\times10^{-3}$ millibars (and/or a different amount of argon pressure). Alternatively and/or additionally, the depositing the first alloy onto the substrate may be performed using a first target-substrate distance. For example, the first target-substrate distance may correspond to a distance between the first alloy target and the substrate (during the first sputtering process). The first target-substrate distance may be about 50 millimeters. Alternatively and/or additionally, the first target-substrate distance may be between 30 millimeters and 100 millimeters (and/or a different distance). Alternatively and/or additionally, the depositing the first alloy onto the substrate may be performed using a first power. For example, the first power may be about 200 watts. Alternatively and/or additionally, the first power may be between 100 watts and 300 watts.

In some examples, the depositing the second alloy onto the second layer may be performed by performing a second sputtering process using the second alloy target. For example, the second sputtering process may comprise the second alloy being sputtered onto the first layer from the second alloy target. Alternatively and/or additionally, prior to the depositing the second alloy onto the first layer using the second alloy target, the second alloy target may be prepared. For example, VAR may be performed using a fourth alloy to produce the second alloy target. For example, the fourth alloy may be forged and/or annealed to produce the second alloy target.

In some examples, a third composition of the fourth alloy and/or the second alloy target may be similar to a fourth composition of the second layer. Alternatively and/or additionally, the third composition of the fourth alloy and/or the second alloy target may be different than the fourth composition of the second layer. For example, titanium of the second alloy target may be present at a percentage within the third range and/or may be about 51 atomic %. Alternatively and/or additionally, the titanium of the second alloy target may be present at a percentage outside of the third range and/or greater than an atomic percentage of the titanium of the second layer in order to take into account a loss of titanium of the second alloy while the second alloy is sputtered onto the first layer from the second alloy target.

In some examples, the second sputtering process may be a second DC magnetron sputtering process. Alternatively and/or additionally, the second sputtering process may be a second RF magnetron sputtering process. In some examples, during the depositing the second alloy onto the first layer, the object (upon which the substrate and/or the first layer is mounted and/or held) may be moved and/or rotated such that a second uniform distribution of composition (e.g., film uniformity) associated with the second layer is achieved.

In some examples, the depositing the second alloy onto the first layer may be performed using a second base pressure. For example, the second base pressure may be less than $10^{-7}$ millibars (and/or a different amount of pressure). The second base pressure may be the same as the first base pressure. Alternatively and/or additionally, the second base pressure may be different than the first base pressure. Alternatively and/or additionally, the depositing the second alloy onto the first layer may be performed using a second argon pressure (e.g., "$P_{Ar}$"). The second argon pressure may be about $3 \times 10^{-3}$ millibars. Alternatively and/or additionally, the second argon pressure may be between $2 \times 10^{-3}$ millibars and $4 \times 10^{-3}$ millibars (and/or a different amount of argon pressure). The second argon pressure may be the same as the first argon pressure. Alternatively and/or additionally, the second argon pressure may be different than the first argon pressure.

Alternatively and/or additionally, the depositing the second alloy onto the first layer may be performed using a second target-substrate distance. For example, the second target-substrate distance may correspond to a distance between the second alloy target and the substrate (during the second sputtering process). The second target-substrate distance may be about 50 millimeters. Alternatively and/or additionally, the second target-substrate distance may be between 30 millimeters and 100 millimeters (and/or a different distance). The second target-substrate distance may be the same as the first target-substrate distance. Alternatively and/or additionally, the second target-substrate distance may be different than the first target-substrate distance. Alternatively and/or additionally, the depositing the second alloy onto the first layer may be performed using a second power. For example, the second power may be about 200 watts. Alternatively and/or additionally, the second power may be between 100 watts and 300 watts. The second power may be the same as the first power. Alternatively and/or additionally, the second power may be different than the first power.

In some examples, the first sputtering process and the second sputtering process may be performed during a first duration of time. For example, the first duration of time may correspond to a total duration of time that it takes to complete both the first sputtering process and the second sputtering process. For example, the first duration of time may be between 30 minutes and 120 minutes. Alternatively and/or additionally, the first duration of time may correspond to a duration of time that it takes to merely complete one of the first sputtering process or the second sputtering process. In some examples, a first thickness of the first layer and/or a second thickness of the second layer may be associated with the first duration of time (e.g., an increase of the first duration of time may correspond to an increase of the first thickness and/or the second thickness).

It may be appreciated that rather than depositing the first alloy onto the substrate to form the first layer and depositing the second alloy onto the first layer to form the second layer such that the bi-layer thin film has the first structure (e.g., where the first layer is on top of the substrate and the second layer is on top of the first layer), the second alloy may be deposited onto the substrate to form the second layer and the first alloy may be deposited onto the second layer to form the first layer, such that the bi-layer thin film has the second structure (e.g., where the second layer is on top of the substrate and the first layer is on top of the second layer).

In some examples, the first thickness of the first layer may be about 1 micrometer. Alternatively and/or additionally, the first thickness of the first layer may be between 0.5 micrometers and 1.5 micrometers (and/or a different thickness). The second thickness of the second layer may be about 1 micrometer. Alternatively and/or additionally, the second thickness of the second layer may be between 0.5 micrometers and 1.5 micrometers (and/or a different thickness). In some examples, the second thickness may be the same as the first thickness. Alternatively and/or additionally, the second thickness may be different than the first thickness.

In some examples, in an instance where the substrate is made of poly (4,4'-oxydiphenylene-pyromellitimide) (e.g., Kapton™) (and/or a different type of polyimide), a third thickness of the substrate may be about 25 micrometers. Alternatively and/or additionally, in the instance where the substrate is made of poly (4,4'-oxydiphenylene-pyromellitimide) (e.g., Kapton™) (and/or the different type of polyimide), the third thickness of the substrate may be between 10 micrometers and 40 micrometers. Alternatively and/or additionally, in an instance where the substrate is made of silicone, the third thickness of the substrate may be about 0.3 millimeter. Alternatively and/or additionally, in the instance where the substrate is made of silicone, the third thickness of the substrate may be between 0.2 millimeters and 1 millimeters.

In some examples, the bi-layer thin film (e.g., the first layer, the second layer and/or the substrate) may be annealed at a third temperature for a second duration of time. For example, the bi-layer thin film may be annealed in order to crystallize the first layer and/or the second layer. For example, the first layer and/or the second layer may be amorphous after the first sputtering process and/or the second sputter process. In some examples, the bi-layer thin film may be annealed using a vacuum (e.g., a turbo molecular vacuum). Alternatively and/or additionally, the bi-layer thin film may be annealed using a base pressure of less than $10^{-7}$ millibars (and/or a different amount of pressure).

The third temperature may be about 465° C. Alternatively and/or additionally, the third temperature may be about 500° C. Alternatively and/or additionally, the third temperature may be a temperature between 465° C. and 500° C. For example, the third temperature may be a temperature between 465° C. and 475° C. Alternatively and/or additionally, the third temperature may be a temperature between 490° C. and 500° C.

In some examples, the second duration of time may be about 30 minutes. Alternatively and/or additionally, the second duration of time may be about 60 minutes. Alternatively and/or additionally, the second duration of time may be between 30 minutes and 60 minutes. For example, the second duration of time may be between 30 minutes and 40 minutes. Alternatively and/or additionally, the second duration of time may be between 50 minutes and 60 minutes.

In some examples, the bi-layer thin film may be annealed at a heating rate of about 10° C./minute (and/or a different heating rate). For example, once a temperature of the bi-layer thin film reaches the third temperature and/or a temperature of an atmosphere surrounding the bi-layer thin film reaches the third temperature, the third temperature may be maintained for the second duration of time. Upon completion of the second duration of time, the temperature of the bi-layer thin film and/or the temperature of the atmosphere surrounding the bi-layer thin film may be lowered at a cooling rate of about 10° C./minute (and/or a different cooling rate) until the temperature of the bi-layer thin film and/or the temperature of the atmosphere surrounding the bi-layer thin film reaches room temperature (e.g., between 20° C. and 25° C.) and/or a different temperature.

It may be appreciated that the second duration of time and/or the third temperature are configured such that one or more reactions (e.g., one or more chemical reactions) between the first layer and the substrate and/or between the second layer and the substrate are minimized and/or reduced (e.g., such that changes in a microstructure of the first layer and/or the second layer are minimal, such that changes in mechanical properties of the first layer and/or the second layer are minimal, such that changes in SME behavior associated with the first layer and/or the second layer are minimal, etc.).

3 Properties of Bi-Layer Thin Film

Figure 2:
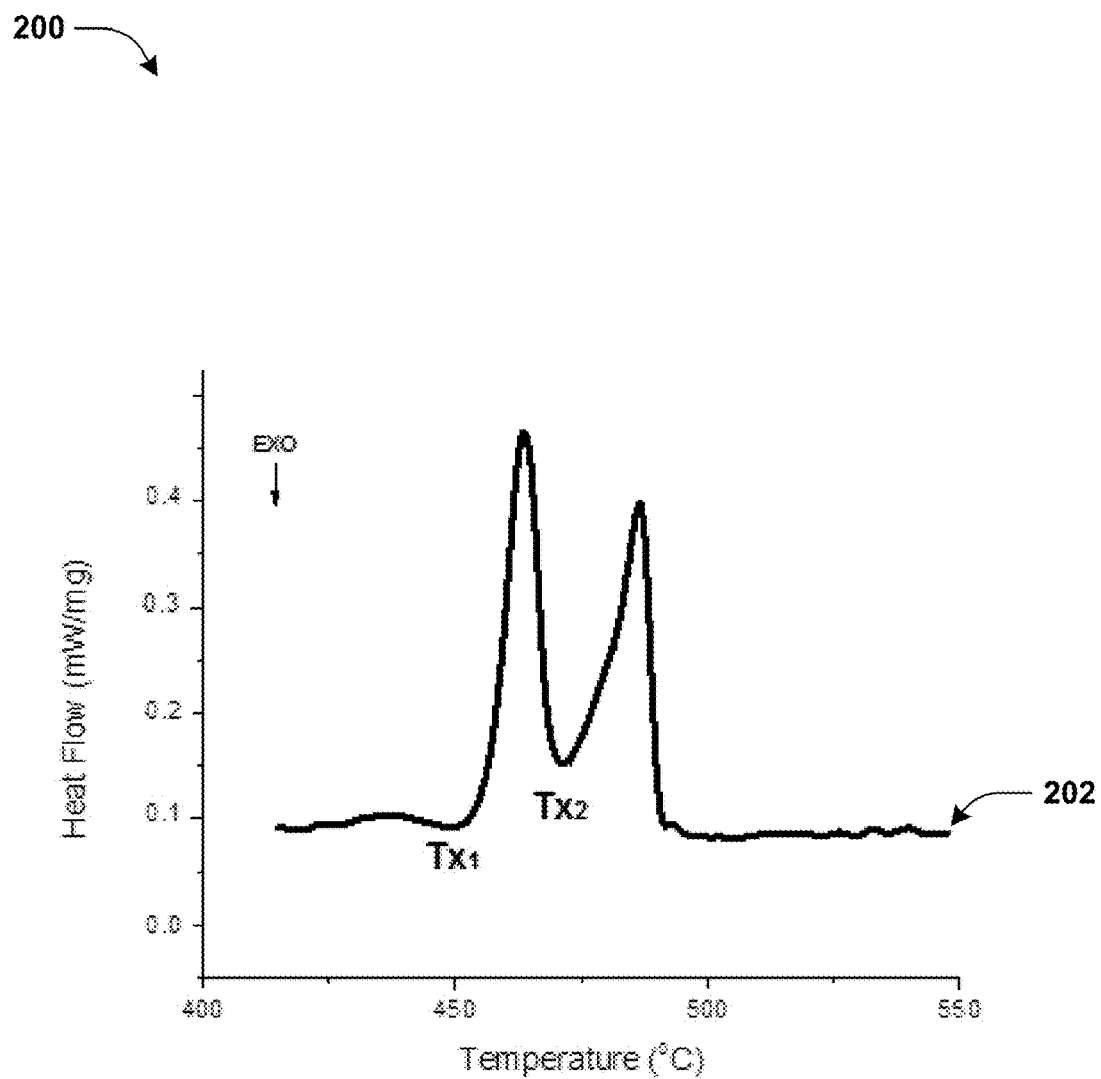
FIG. 2 is an illustration of a heating diagram corresponding to an as-deposited bi-layer thin film.

FIG. 2 illustrates a heating diagram 200 corresponding to an as-deposited instance of the bi-layer thin film (e.g., the as-deposited instance of the bi-layer thin film may correspond to the bi-layer thin film before being annealed). Heat flow (milliwatts per milligram) values (e.g., y-axis) are shown as a function of temperature (° C.) values (e.g., x-axis). For example, the heating diagram 200 may comprise a heating curve 202. The heating curve 202 may correspond to a continuous heating Differential Scanning calorimeter (DSC) trace generated based upon the bi-layer thin film. For example, one or more crystallization temperatures and/or one or more transformation temperatures may be measured (while the bi-layer thin film is being heated) using a DSC measuring device (e.g., such as a NETZSH DSC 404 device). One or more exothermic processes associated with one or more crystallization processes the bi-layer thin film undergoes (while the bi-layer thin film is being heated) may occur. For example, a first crystallization temperature $Tx_1$ may be about 450° C. Alternatively and/or additionally, a second crystallization temperature $Tx_2$ may be about 460° C. In some examples, the third temperature (associated with the bi-layer thin film being annealed) may be configured based upon the heating diagram 200. A crystallization temperature of the first layer (e.g., the Ni-rich layer) may be determined to be about 460° C., a crystallization temperature of an instance of the second layer (e.g., the Ti-rich layer) that does not comprise copper may be determined to be about 460° C. and/or a crystallization temperature of an instance of the second layer that comprises copper may be determined to be about 450° C.

Figure 3:
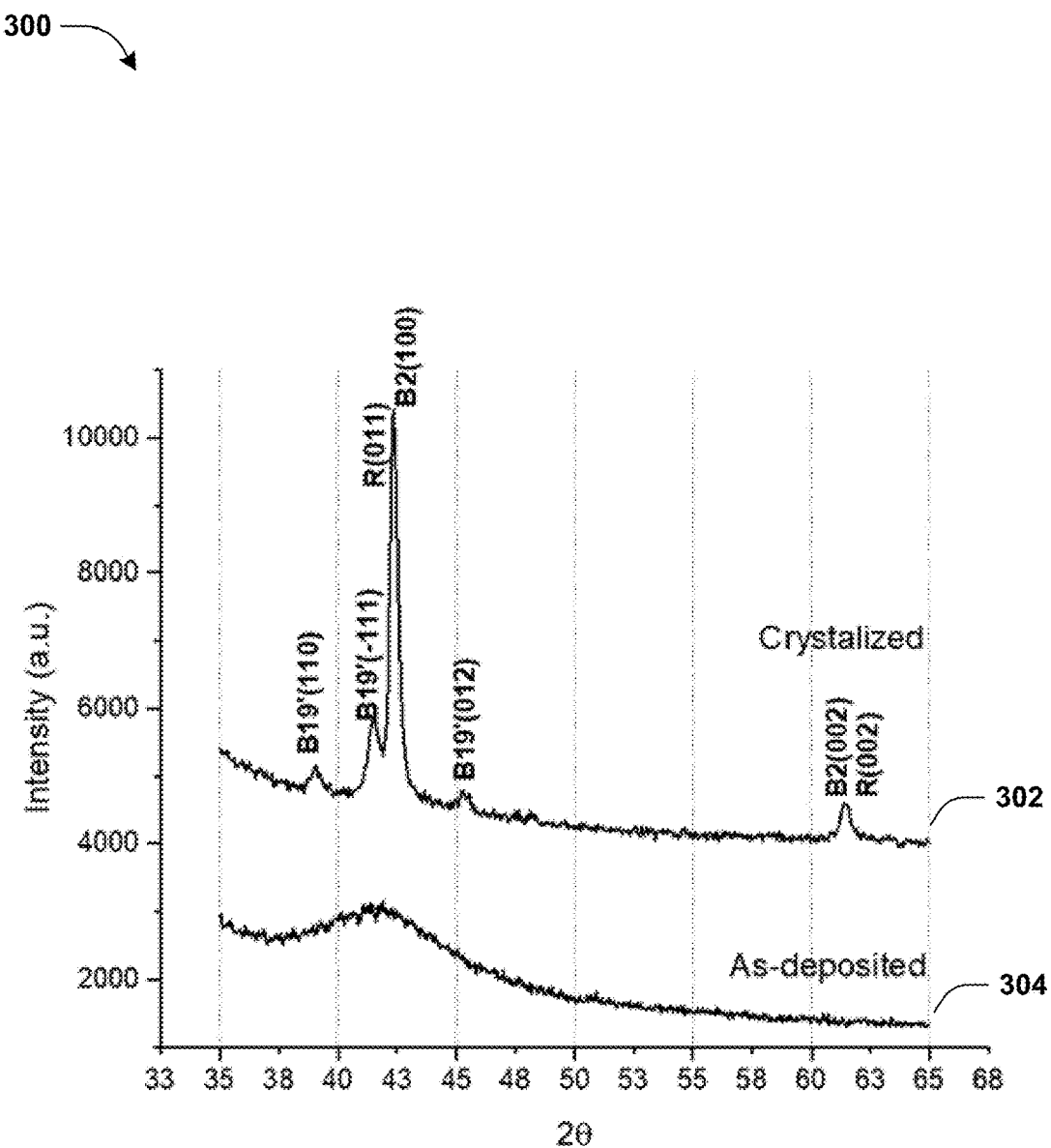
FIG. 3 is an illustration of an X-ray diffraction (XRD) diagram corresponding to a bi-layer thin film.

FIG. 3 illustrates an X-ray diffraction (XRD) diagram corresponding to the bi-layer thin film. Intensity (arbitrary unit (a.u.)) values (e.g., y-axis) are shown as a function of 2-theta (2θ) values (e.g., x-axis). For example, a first intensity curve 302 may correspond to the bi-layer thin film after being annealed. Alternatively and/or additionally, a second intensity curve 304 may correspond to the bi-layer thin film before being annealed (e.g., as deposited). It may be determined using the second intensity curve 304 that the bi-layer thin film is in an amorphous state before being annealed. Alternatively and/or additionally, it may be determined using the first intensity curve 302 that the bi-layer thin film is in a crystallized state after being annealed. For example, the first intensity curve 302 indicates martensite phases (B19'), austenite phases (B2) and/or R phases (e.g., trigonal phases) of the bi-layer thin film after being annealed.

Figures 4A, 4B:
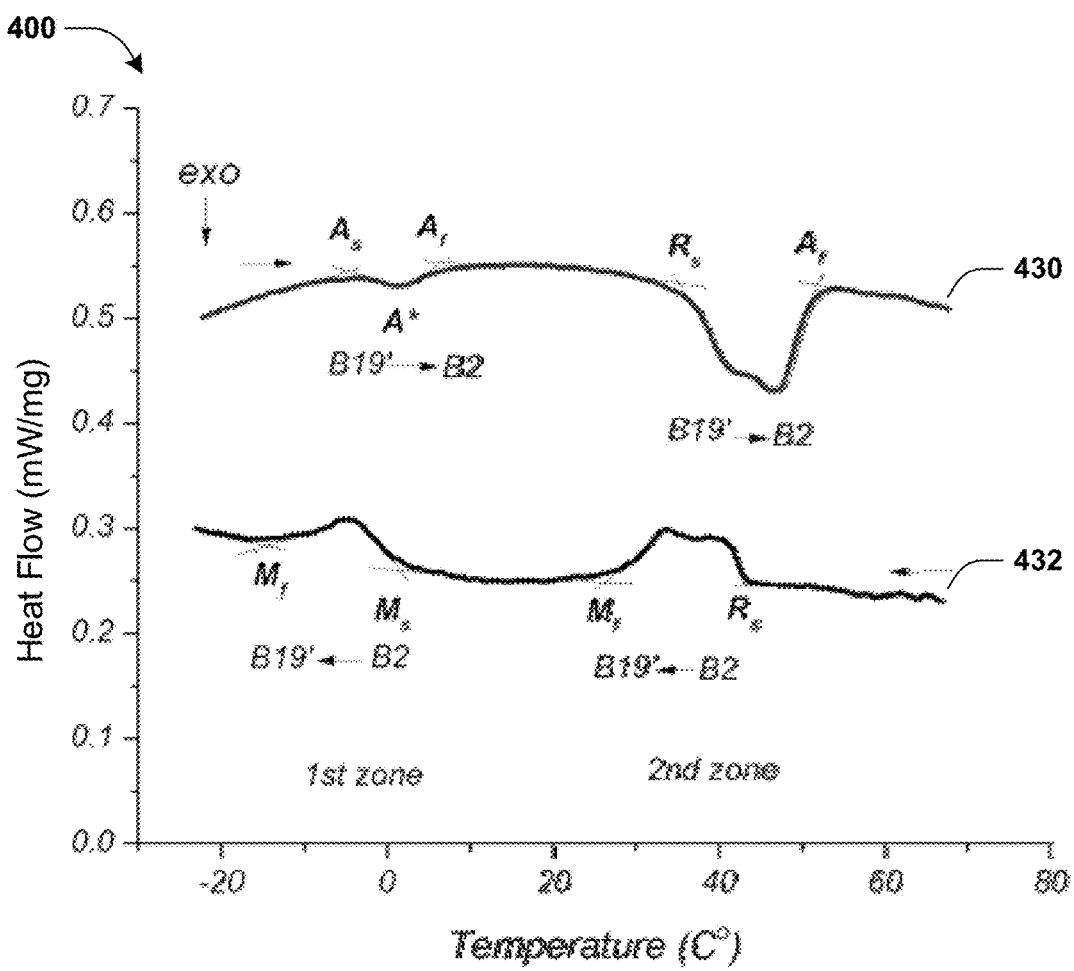
FIG. 4A is an illustration of a second heating diagram corresponding to a crystallized bi-layer thin film.
FIG. 4B is an illustration of a table of phase transformation temperatures associated with a crystallized bi-layer thin film.

FIGS. 4A-4B illustrate crystallization phase behaviors associated with the bi-layer thin film after being annealed. FIG. 4A illustrates a second heating diagram 400 corresponding to a crystallized instance of the bi-layer thin film (e.g., the crystallized instance of the bi-layer thin film may correspond to the bi-layer thin film after being annealed). Heat flow (milliwatts per milligram) values (e.g., y-axis) are shown as a function of temperature (° C.) values (e.g., x-axis). The second heating diagram 400 comprises a first DSC curve 430 corresponding to the bi-layer thin film being heated and/or a second DSC curve 432 corresponding to the bi-layer thin film being cooled.

FIG. 4B illustrates a table 4B of phase transformation temperatures associated with the crystallized instance of the bi-layer thin film. For example, $A_s$ of the table 450, corresponding to a starting temperature of austenite phase, indicates that austenite phase formation may begin during heating of the bi-layer thin film and/or when a temperature associated with the bi-layer thin film is 14° C. Alternatively and/or additionally, $A_f$ of the table 450, corresponding to a finishing temperature of austenite phase, indicates that austenite phase formation may finish during heating of the bi-layer thin film and/or when a temperature associated with the bi-layer thin film is 25° C. Alternatively and/or additionally, $M_s$ of the table 450, corresponding to a starting temperature of martensite phase, indicates that martensite phase formation may begin during cooling of the bi-layer thin film and/or when a temperature associated with the bi-layer thin film is 26° C. Alternatively and/or additionally, $M_f$ of the table 450, corresponding to a finishing temperature of martensite phase, indicates that martensite phase formation may finish during cooling of the bi-layer thin film and/or when a temperature associated with the bi-layer thin film is 16° C. Alternatively and/or additionally, $R_s$ of the table 450, corresponding to a starting temperature of intermediate R-phase, indicates that intermediate R-phase formation may begin during cooling of the bi-layer thin film and/or when a temperature associated with the bi-layer thin film is 36° C. Alternatively and/or additionally, $R_f$ of the table 450, corresponding to a finishing temperature of intermediate R-phase, indicates that intermediate R-phase formation may finish during cooling of the bi-layer thin film and/or when a temperature associated with the bi-layer thin film is 32° C. A temperature difference (ΔT) between the finishing temperature of austenite phase and the starting temperature of martensite phase is about 1° C. which indicates that thermal hysteresis (e.g., and/or a transformation hysteresis) is minimal (which may be due to a composition of the bi-layer thin film and/or may be due to stress gradients being comprised within the bi-layer thin film).

The second heating diagram 400 indicates that there is a first transformation zone "1st zone" and/or a second transformation zone "2nd zone". For example, the first transformation zone may be associated with austenite phase formation during heating and/or martensite phase formation during cooling. The first DSC curve 430 indicates that during heating of the bi-layer thin film, the austenite phase formation may occur. The austenite phase formation may correspond to the first layer (e.g., the Ni-rich layer). Alternatively and/or additionally, the second transformation zone may be associated with multiple-step phase transformation during heating. The multi-step phase transformation may comprise martensite phase (B19') to R phase (R), martensite phase (B19') to austenite phase (B2) and/or R phase (R) to martensite phase (B19') (e.g., (B19'→R, B19'→B2, R→B2)). The first DSC curve 430 indicates that during heating of the bi-layer thin film, the multi-step phase transformation may occur. The multi-step phase transformation may correspond to the second layer (e.g., the Ti-rich layer). In some examples, reverse transformations may occur while the bi-layer thin film is cooled, as indicated by the second DSC curve 432.

Figure 5:
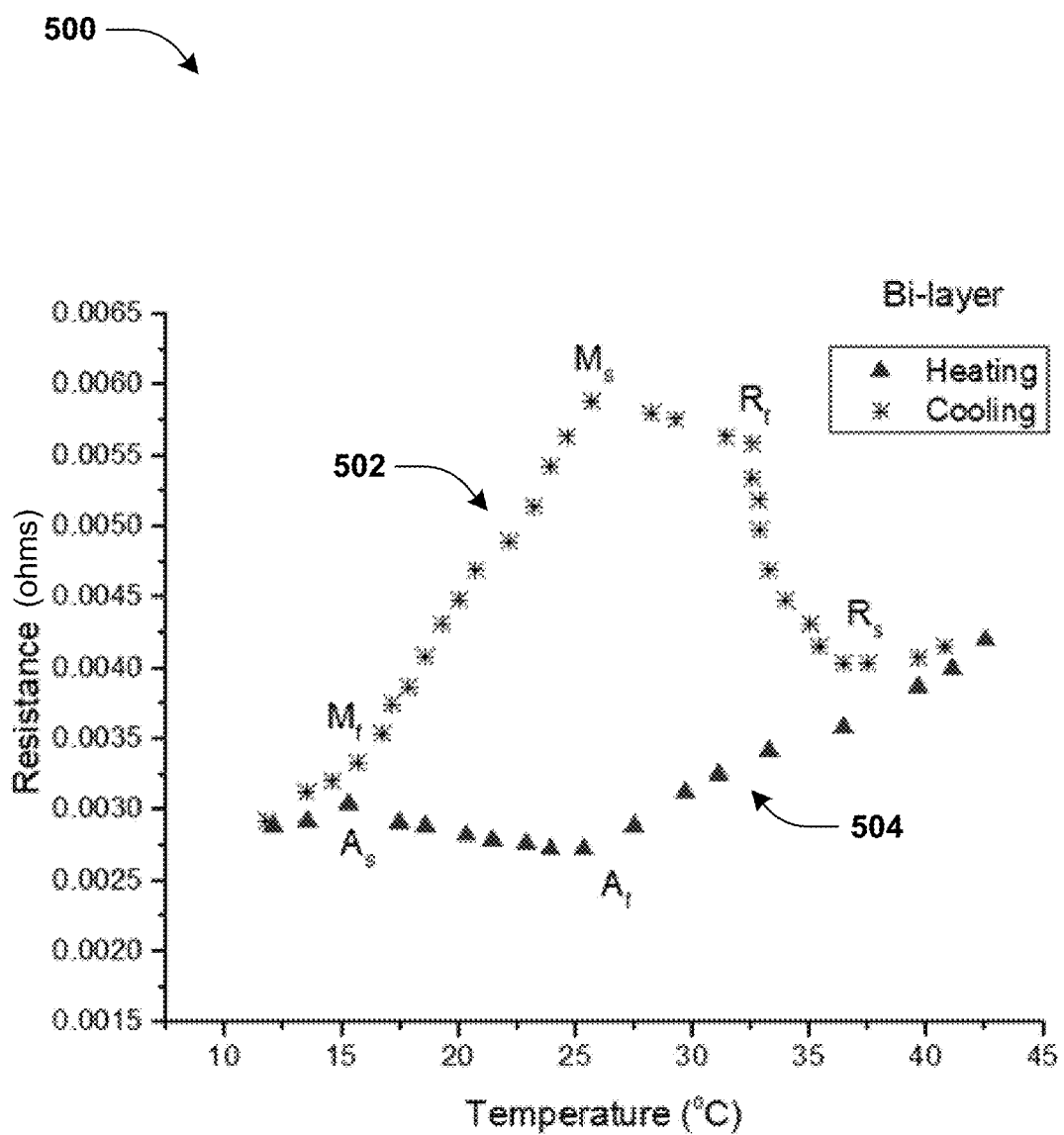
FIG. 5 is an illustration of a resistance diagram associated with a bi-layer thin film after being annealed.

FIG. 5 illustrates a resistance diagram 500 associated with the bi-layer thin film after being annealed. Resistance (ohms) values (e.g., y-axis) are shown as a function of temperature (° C.) values (e.g., x-axis). The resistance diagram 500 comprises a first resistance curve 502 (illustrated via a collection of star-shaped points on the resistance diagram 500) corresponding to the bi-layer thin film being cooled. The resistance diagram 500 comprises a second resistance curve 504 (illustrated via a collection of triangle-shaped points on the resistance diagram 500) corresponding to the bi-layer thin film being heated. For example, the second resistance curve 504 indicates that while the bi-layer thin film is heated, the bi-layer thin film may undergo the austenite phase transformation. Alternatively and/or additionally, the first resistance curve 502 indicates that while the bi-layer thin film is cooled, the bi-layer thin film may undergo R-phase transformation and/or martensite-phase transformation. Accordingly, in a heating and cooling cycle, where the bi-layer thin film undergoes heating up to about 55° C. (and/or a different temperature) and/or cooling down to about 15° C. (and/or a different temperature), the bi-layer thin film may undergo the austenite phase transformation, the R-phase transformation and/or the martensite phase transformation. Further, while the bi-layer thin film is being cooled, a first martensite plate formed at the starting temperature of the martensite phase ($M_s$) may disappear at about a time that the finishing temperature of the austenite phase ($A_f$) is reached while the bi-layer thin film is being heated.

Figure 6A:
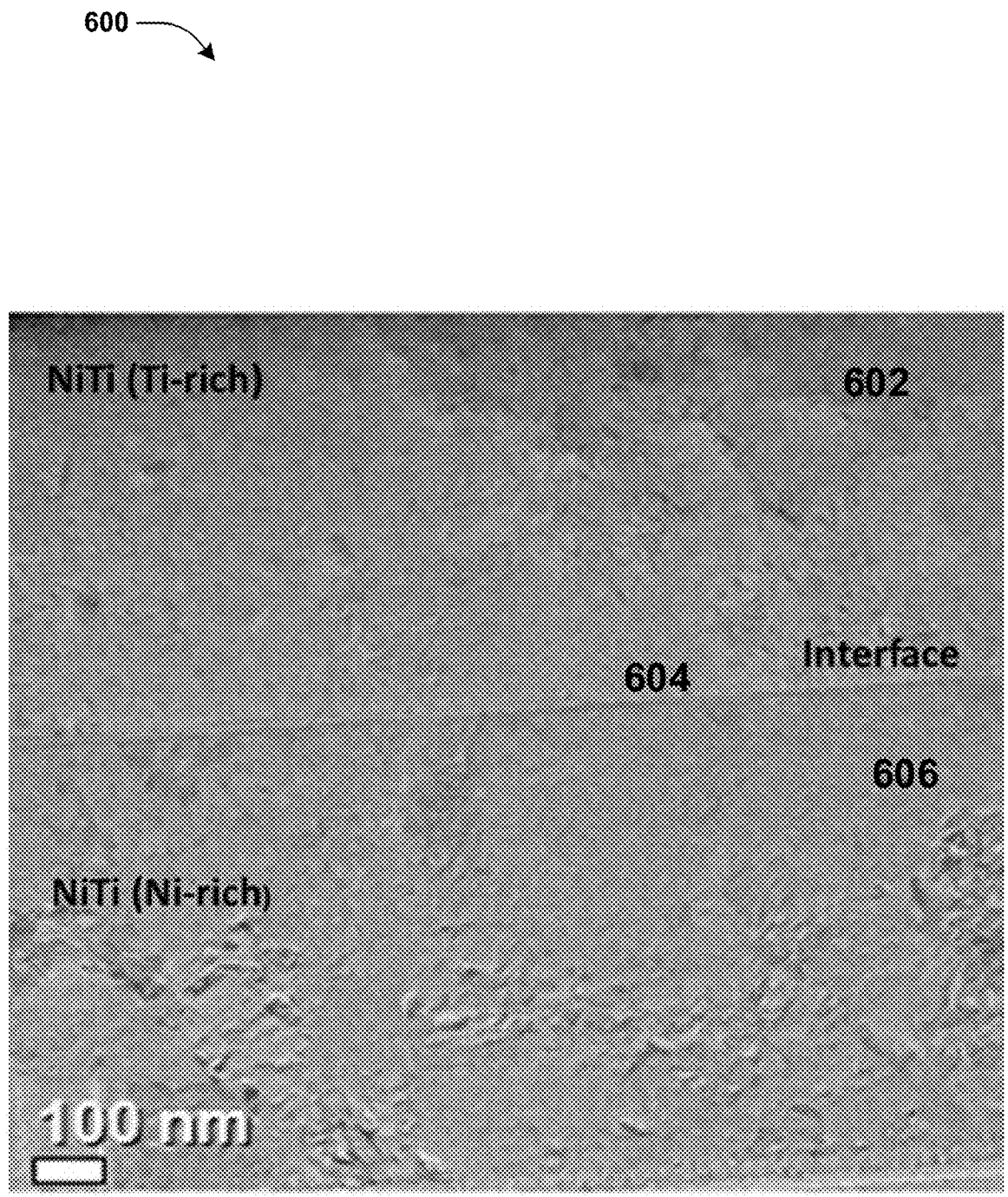
FIG. 6A is an illustration of a first image of a cross section of a bi-layer thin film.

FIGS. 6A-6D illustrate images of one or more cross sections of the bi-layer thin film. For example, the images may be prepared using scanning transmission electron microscopy (STEM) and/or a focused ion beam. FIG. 6A illustrates a first image 600 of a first cross section of the bi-layer thin film. For example, the first image 600 may comprise a representation of an instance where the first layer (e.g., the Ni-rich layer) is beneath the second layer (e.g., the Ti-rich layer). A first area 606 of the first cross section may correspond to the first layer, an interface 604 may correspond to where the first layer and the second layer meet and/or a second area 602 of the first cross section may correspond to the second layer.

The first image 600 illustrates that after the bi-layer thin film is annealed, the bi-layer thin film may be crystallized (e.g., completely crystallized). Alternatively and/or additionally, first nano-crystalline grains (having a size of 30-50 nanometers) may be comprised within the second layer (shown in the second area 602). Alternatively and/or additionally, $Ni_4Ti_3$ precipitates (e.g., lens shaped $Ni_3Ti_4$ precipitates) may be comprised within the first layer (shown in the first area 606). Stress conditions (e.g., uniaxial stress conditions) may induce preferential growth of the $Ni_3Ti_4$ precipitates (and/or selective precipitate variants). A precipitate variant whose habit plane is parallel to a stress axis and/or close to parallel to the stress axis may be formed if a sample is annealed under tensile stress. Alternatively and/or additionally, a precipitate variant whose habit plane is perpendicular to the stress axis and/or close to perpendicular to the stress axis may be formed if a sample is annealed under compression stress.

Figure 6B:
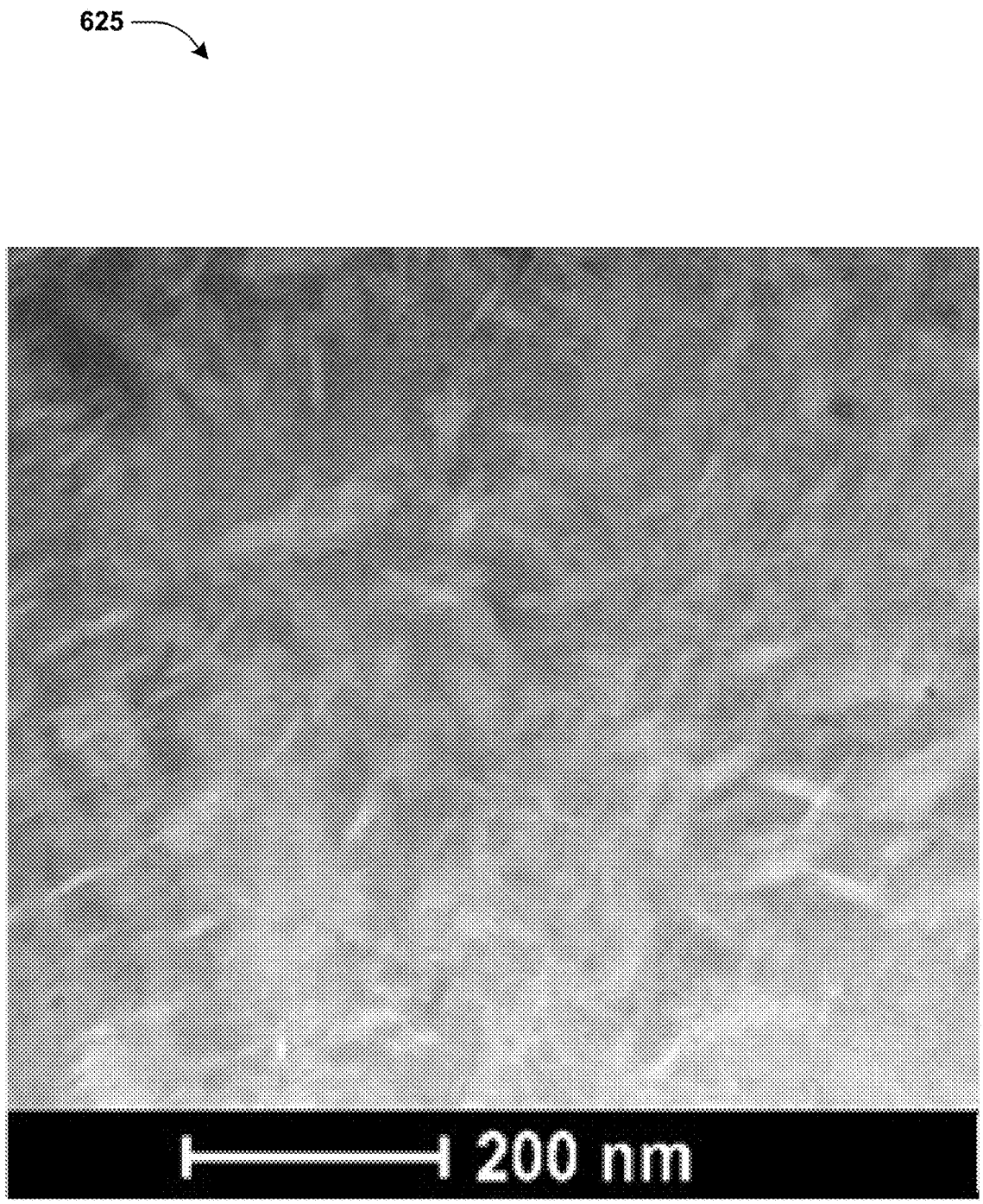
FIG. 6B is an illustration of a second image of a cross section of a bi-layer thin film.
Figure 6C:
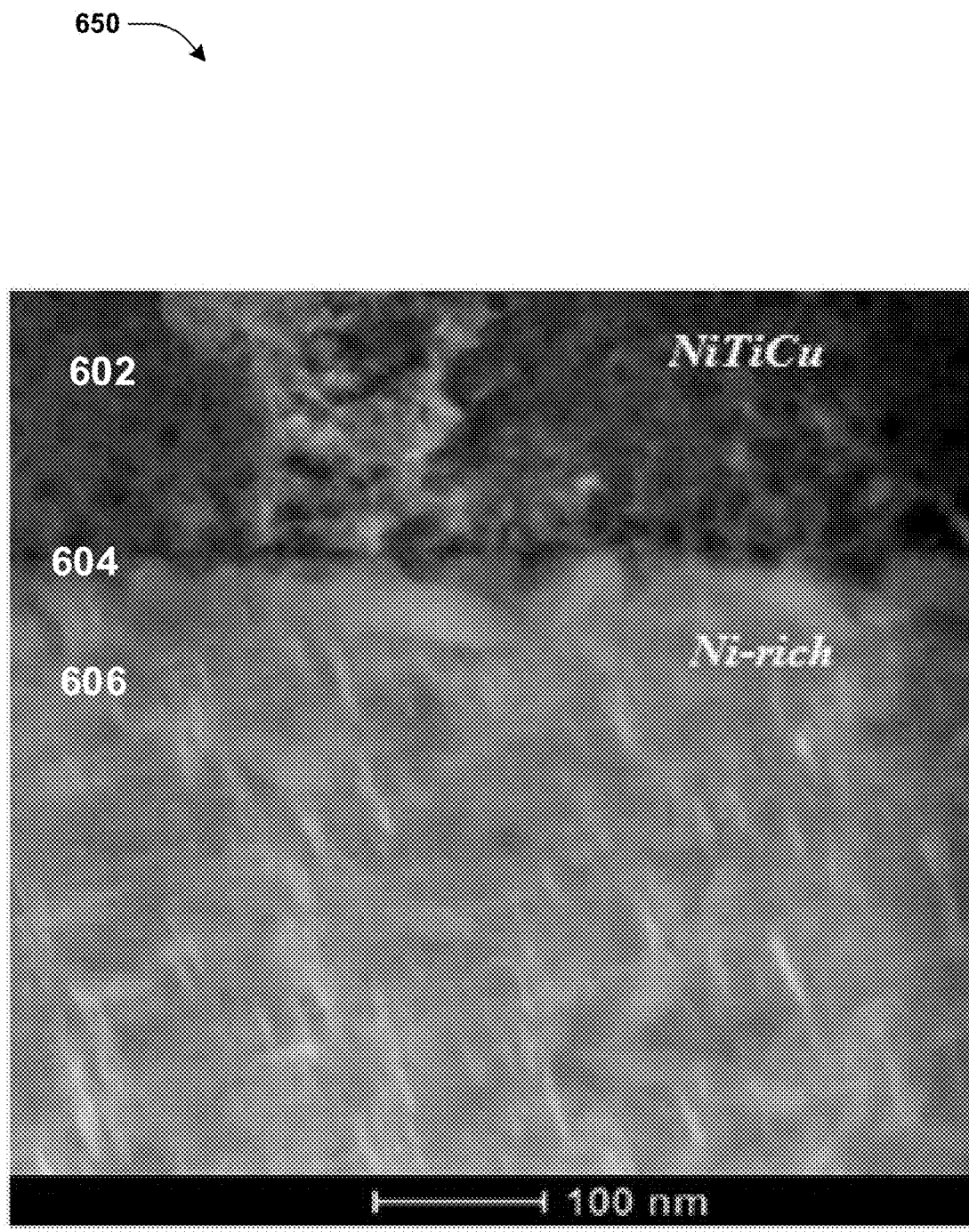
FIG. 6C is an illustration of a third image of a cross section of a bi-layer thin film.

FIG. 6B illustrates a second image 625 of a second cross section of the bi-layer thin film. The second image 625 shows a first portion of $Ni_3Ti_4$ precipitates of the $Ni_3Ti_4$ precipitates of the first layer. FIG. 6C illustrates a third image 650 of a third cross section of the bi-layer thin film. In some examples, the third image 650 may comprise a representation of an instance where the second layer comprises copper. The third image 650 shows a second portion of $Ni_3Ti_4$ precipitates of the $Ni_3Ti_4$ precipitates of the first layer. The first portion of $Ni_3Ti_4$ precipitates that are closer to the substrate than the second portion of $Ni_3Ti_4$ precipitates may have a more horizontal orientation (e.g., directionality) than the second portion of $Ni_3Ti_4$ precipitates that are closer to the interface 604 (e.g., the second portion of $Ni_3Ti_4$ precipitates may have a more vertical orientation (e.g., directionality) than the first portion of $Ni_3Ti_4$ precipitates). Variations in orientations of the first portion of $Ni_3Ti_4$ precipitates and the second portion of $Ni_3Ti_4$ precipitates indicate that the bi-layer thin film has a stress gradient. Alternatively and/or additionally, R-phase transformation may occur due to a buildup of internal stresses of the bi-layer thin film and/or due to depletion of nickel in a matrix associated with the bi-layer thin film.

Figure 6D:
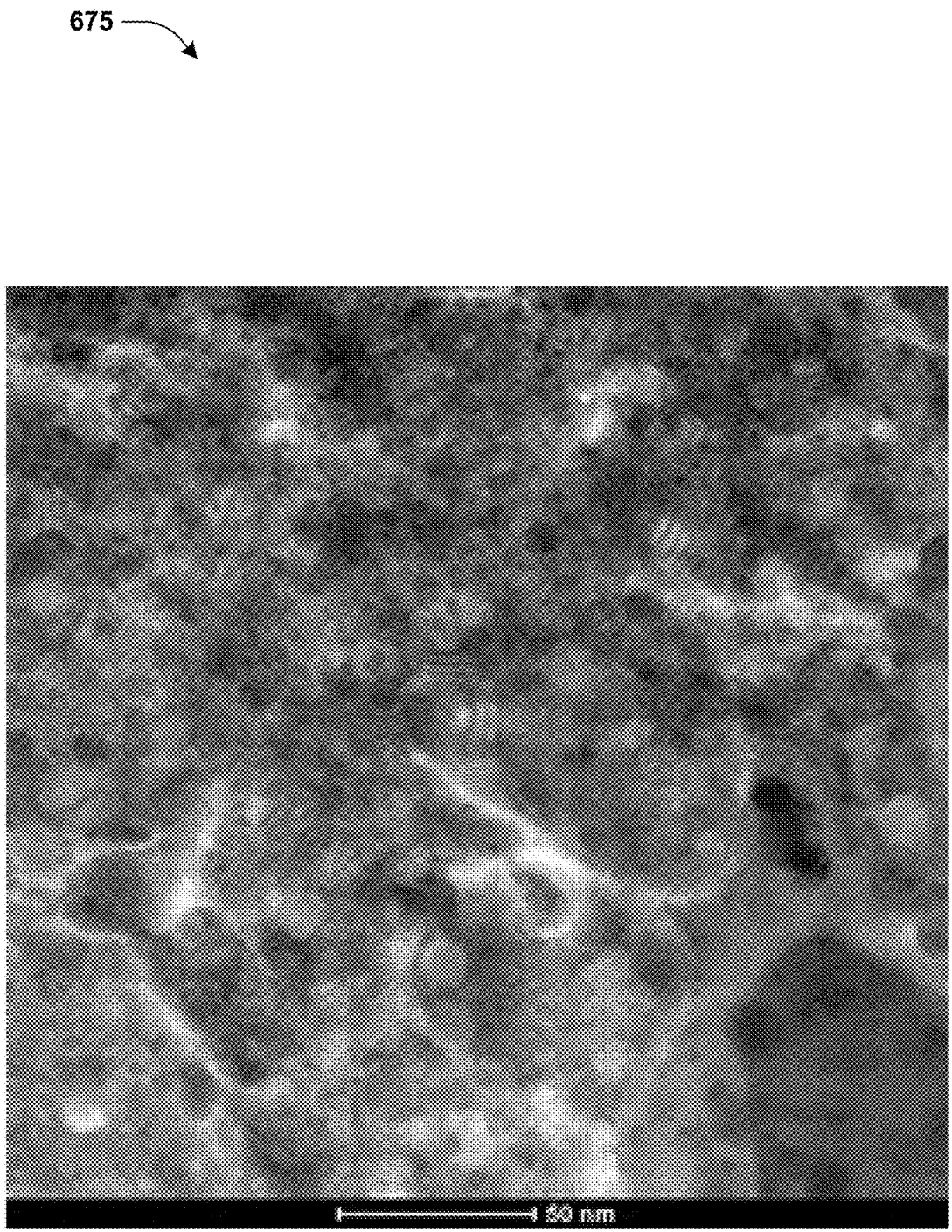
FIG. 6D is an illustration of a fourth image of a cross section of a bi-layer thin film.

FIG. 6D illustrates a fourth image 675 of a fourth cross section of the bi-layer thin film. The fourth image 675 shows a portion of the second area 602 and/or the second layer (e.g., the Ti-rich layer). In some examples, the second layer may comprise precipitates in grain interiors (of the first nano-crystalline grains) of the second layer. The precipitates produce distorted moiré fringes which may indicate that the bi-layer thin film has (substantial) local strain fields.

Figure 7:
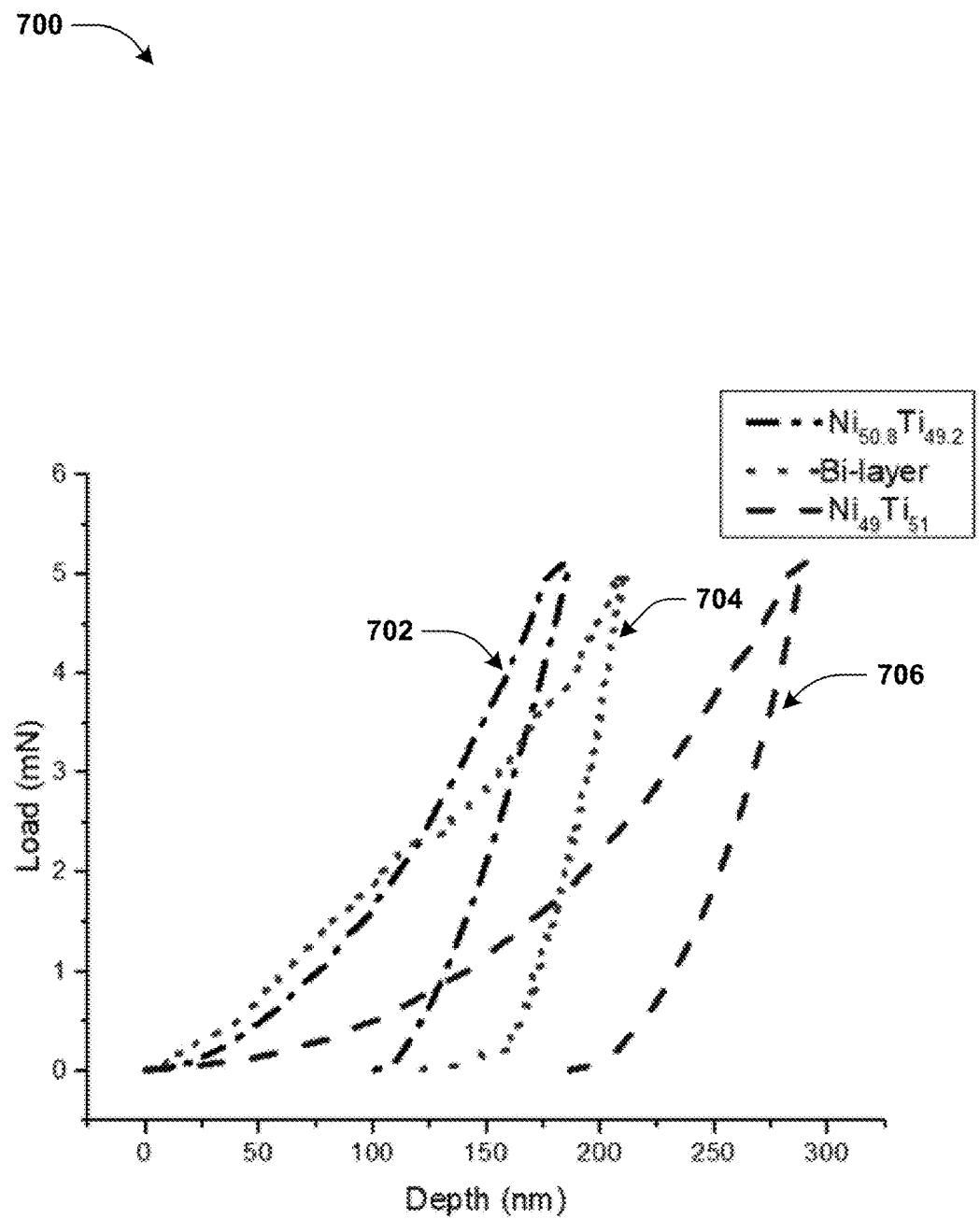
FIG. 7 is an illustration of a first load displacement diagram associated with a bi-layer thin film after being annealed.

FIG. 7 illustrates a first load displacement diagram 700 associated with the bi-layer thin film after being annealed. Load (milli-Newtons) values (e.g., y-axis) are shown as a function of indentation depth (nanometers) values (e.g., x-axis). For example, the bi-layer thin film may be subjected to a nanoindentation process (e.g., which may be performed using a nanoindenter device) using an indenter (e.g., a diamond indenter). For example, the nanoindentation process may comprise a loading step from 0 milli-Newtons to 5 milli-Newtons and an unloading step from 5 milli-Newtons to 0 milli-Newtons. The first load displacement diagram 700 may comprise a first load displacement curve 702 corresponding to an Ni-rich thin film (e.g., a first single layer thin film). Alternatively and/or additionally, the first load displacement diagram may comprise a second load displacement curve 704 corresponding to the bi-layer thin film. Alternatively and/or additionally, the first load displacement diagram may comprise a third load displacement curve 706 corresponding to a Ti-rich thin film (e.g., a second single layer thin film).

In some examples, the second load displacement curve 704 may correspond to an instance of the bi-layer thin film where the first layer (e.g., the Ni-rich layer, where an austenitic structure is dominant) is below the second layer (e.g., the Ti-rich layer, which has a martensitic structure). Elastic recovery associated with nanoindentation of the bi-layer thin film is more complex than elastic recoveries associated with nanoindentation of the Ni-rich thin film and/or nanoindentation of the Ti-rich thin film, which may be due to an effect of the interface 604 and/or a composition gradient across the bi-layer thin film, which may lead to a variation in the second load displacement curve 704 as compared with the first load displacement curve 702 and/or the third load displacement curve 706. Indentation-induced super elasticity may be characterized by a depth recovery ratio of the second load displacement curve 704, where the depth recovery ratio may be determined based upon equation 1: Depth Recovery Ratio $(\mu)=(h_{max}-h_r)/h_{max}$.

In the equation 1, $h_{max}$ may be a first indentation depth (e.g., penetration depth) associated with an indentation load being at a maximum load and/or $h_r$ may be a second indentation depth associated with the indentation load returning to 0 (e.g., responsive to unloading). Depth recovery ratio ($\mu$) associated with the bi-layer thin film may be about 0.4 (and/or a different value). Processes occurring during indentation (e.g., the loading step and/or the unloading step) may be associated with Johnson's spherical cavity model, where deformation of a portion of the bi-layer thin film under the indenter occurs by plastic deformation in a region close to the indenter where stresses are higher than a threshold level of stress, martensite twin-rearrangement in a martensitic structure, stress-induced martensitic transformation (pseudo-elasticity) in an austenitic structure and/or elastic deformation in a region far from the indenter (e.g., where a distance between the region and the indenter is greater than a threshold distance). In some examples, a phase transformation-elastic boundary radius may be determined based upon equation 2:

$$C = \frac{d}{\tan\beta}\left[\frac{E\tan\beta}{6Y(1-v)} + \frac{2-4v}{3-3v}\right]^{1/3}.$$

Figure 8:
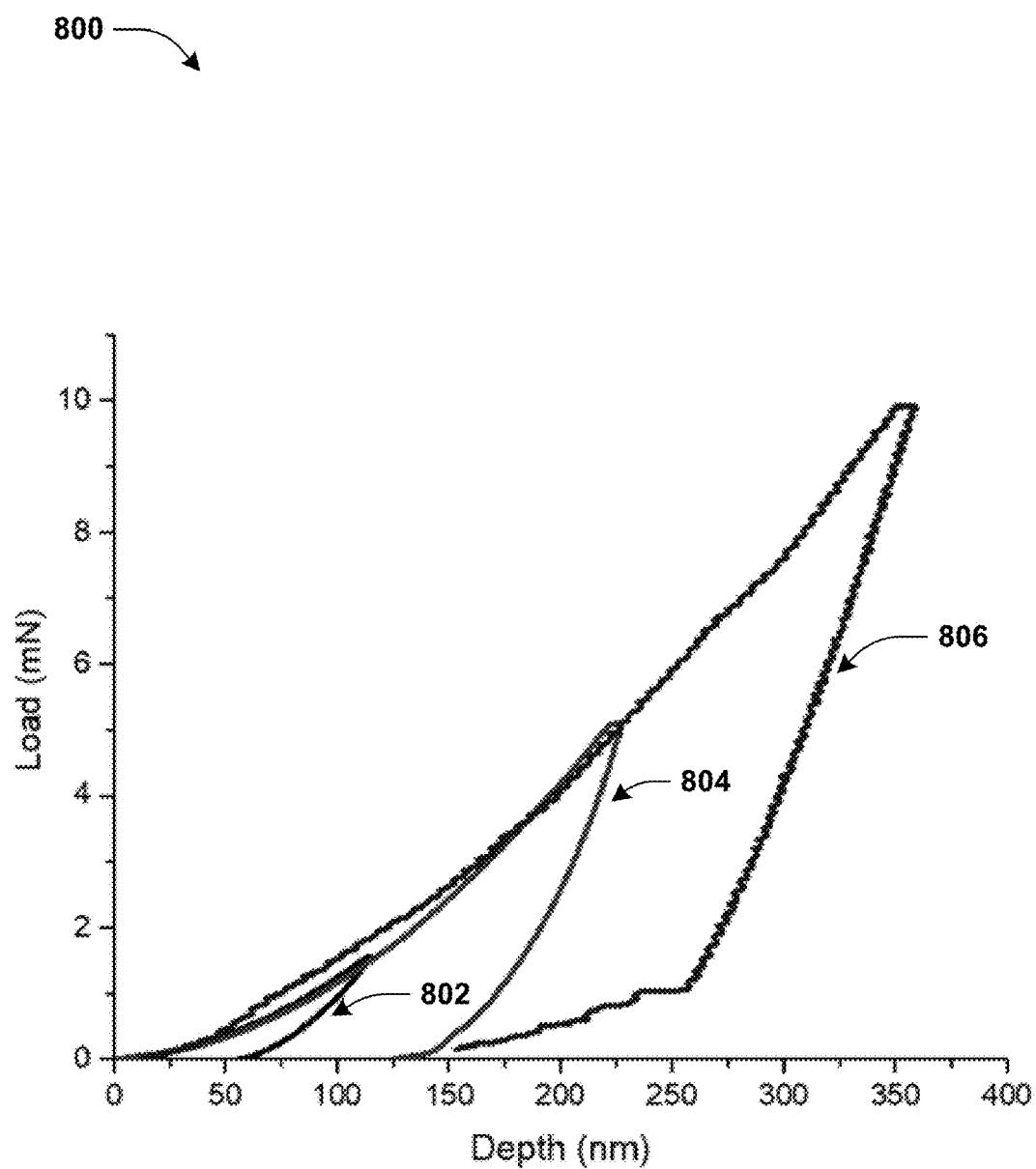
FIG. 8 is an illustration of a second load displacement diagram associated with a bi-layer thin film after being annealed.

In the equation 2, C may be first a phase transformation-elastic boundary radius, d may be an indentation depth, $\beta$ may be an angle between a surface of the bi-layer thin film and the indenter (e.g., 24.65° for a Berkovich indenter), E is Young's modulus which may be determined based upon nanoindentation results associated with a second load displacement diagram 800 of FIG. 8, Y may be a yield stress associated with the bi-layer thin film (e.g., $Y_{Martensite}=2$ gigapascals (GPa) associated with critical stress for martensite twin-reorientation, $Y_{Austenite}=0.6$ GPa associated with critical stress-induced martensitic transformation, and/or $Y_{Bi-layer\ thin\ film}=0.4$ GPa corresponding to an average of $Y_{Martensite}$ and $Y_{Austenite}$), and/or v may be Poisson's ratio (e.g., 0.33 for NiTi alloys). Based upon equation 2, it may be determined that the first phase transformation-elastic boundary radius (C) associated with the bi-layer thin film is about 1.4 micrometers. Accordingly, a portion of a phase transformation zone may be located in the first layer which may result in an increase in a recovery ratio due to a pseudo elastic effect of the first layer.

FIG. 8 illustrates the second load displacement diagram 800 associated with the bi-layer thin film after being annealed. Load (milli-Newtons) values (e.g., y-axis) are shown as a function of indentation depth (nanometers) values (e.g., x-axis). For example, the second load displacement diagram 800 may comprise a fourth load displacement curve 802 corresponding to the bi-layer thin film being subjected to a first nanoindentation process corresponding to a load force of about 1.5 milli-Newtons. Alternatively and/or additionally, the second load displacement diagram 800 may comprise a fifth load displacement curve 804 corresponding to the bi-layer thin film being subjected to a second nanoindentation process corresponding to a load force of about 5 milli-Newtons (similar to the second load displacement curve 704 of FIG. 7). Alternatively and/or additionally, the second load displacement diagram 800 may comprise a sixth load displacement curve 806 corresponding to the bi-layer thin film being subjected to a third nanoindentation process corresponding to a load force of about 10 milli-Newtons.

In some examples, a second phase transformation boundary radius associated with the fourth load displacement curve 802 may be less than the second thickness of the second layer such that merely the second layer may become deformed. Alternatively and/or additionally, a third phase transformation boundary radius associated with the sixth load displacement curve 806 (with a load force of about 10 milli-Newtons rather than about 1.5 milli-Newtons associated with the fourth load displacement curve 802) may be greater than the second thickness of the second layer such that the first layer may be affected and/or the austenitic structure of the first layer may enhance recovery of the bi-layer thin film. For example, by increasing a load force in the bi-layer thin film, a part of a deformation region that occurs is located in the first layer having the austenitic structure, which may occur due to phase transformation. Elastic and/or pseudo-elastic formation may occur in the first layer which may cause the first layer to recover.

Figure 9A:
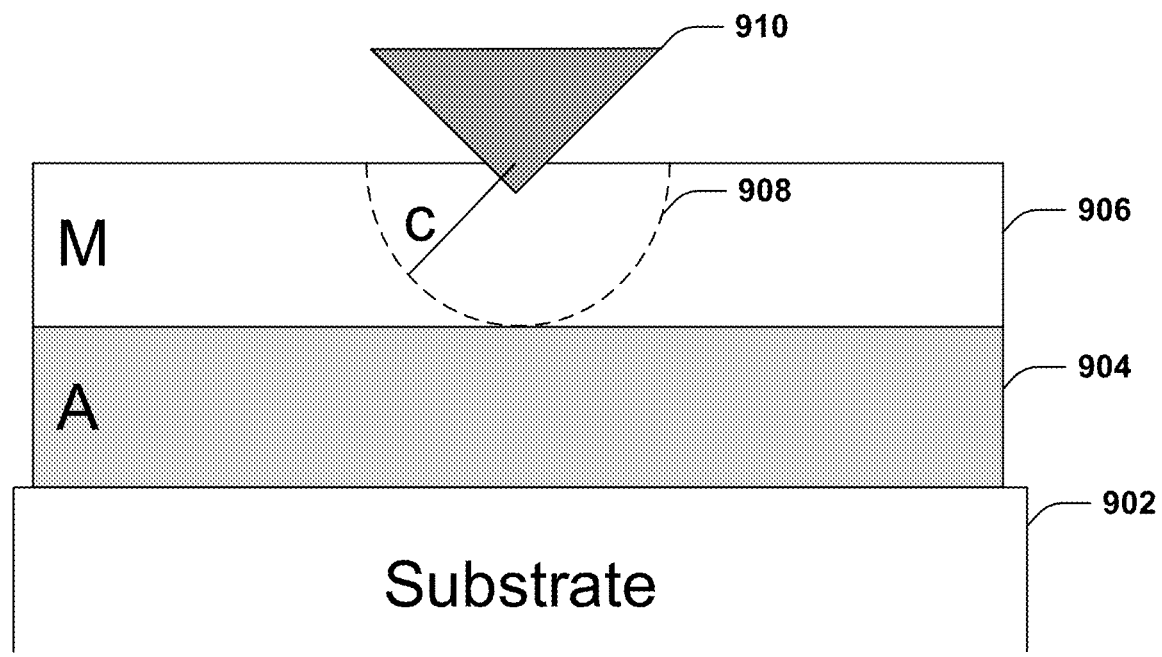
FIG. 9A is an illustration of a bi-layer thin film being subjected to a first nanoindentation process, where the first nanoindentation process is performed using a load force of about 1.5 milli-Newtons.
Figure 9B:
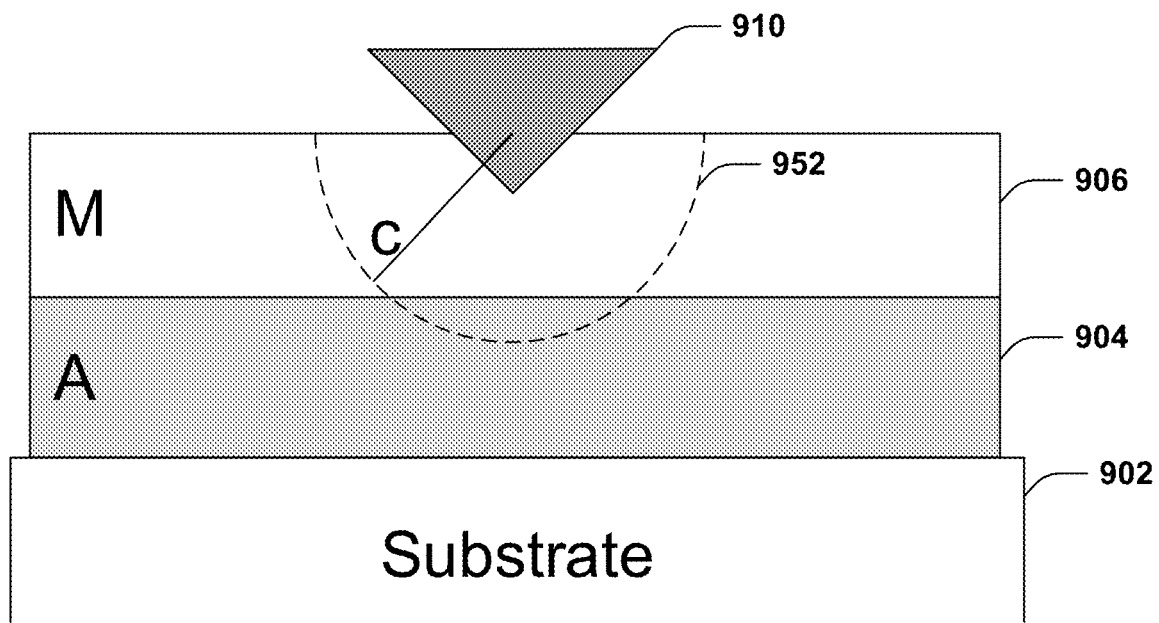
FIG. 9B is an illustration of a bi-layer thin film being subjected to a second nanoindentation process, where the second nanoindentation process is performed using a load force of about 5 milli-Newtons.
Figure 9C:
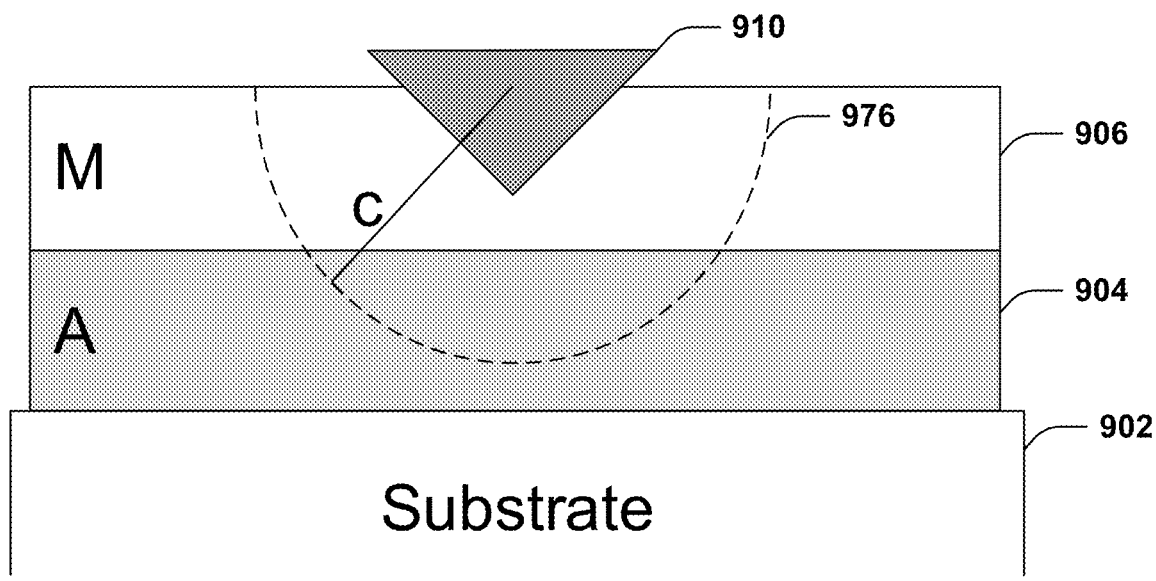
FIG. 9C is an illustration of a bi-layer thin film being subjected to a third nanoindentation process, where the third nanoindentation process is performed using a load force of about 10 milli-Newtons.

FIGS. 9A-9C illustrate schematic diagrams corresponding to the first nanoindentation process associated with the fourth load displacement curve 802, the second nanoindentation process associated with the fifth load displacement curve 804 and/or the third nanoindentation process associated with the sixth load displacement curve 806. FIG. 9A illustrates the bi-layer thin film being subjected to the first nanoindentation process using an indenter 910, where the first nanoindentation process is performed using a load force of about 1.5 milli-Newtons. The bi-layer thin film may comprise a martensitic structure 906 (corresponding to the second layer (e.g., the Ti-rich layer)) on top of an austenitic structure 904 (e.g., corresponding to the first layer (e.g., the Ni-rich layer)) which may be on top of a substrate 902. A first deformation region 908 may occur due to the first nanoindentation process. For example, the first deformation region may have the second phase transformation boundary radius and/or the first deformation region 906 may cover merely a portion of the martensitic structure 906 (corresponding to the second layer).

FIG. 9B illustrates the bi-layer thin film being subjected to the second nanoindentation process using the indenter 910, where the second nanoindentation process is performed using a load force of about 5 milli-Newtons. A second deformation region 952 may occur due to the second nanoindentation process. For example, the second deformation region 952 may have the first phase transformation boundary radius. The second deformation region 952 may cover a portion of the martensitic structure 906 and/or a portion of the austenitic structure 904. FIG. 9C illustrates the bi-layer thin film being subjected to the third nanoindentation process using the indenter 910, where the third nanoindentation process is performed using a load force of about 10 milli-Newtons. A third deformation region 976 may occur due to the third nanoindentation process. For example, the third deformation region 976 may have the third phase transformation boundary radius. The third deformation region 976 may cover a portion of the martensitic structure 906 and/or a portion of the austenitic structure 904.

Figure 10A:
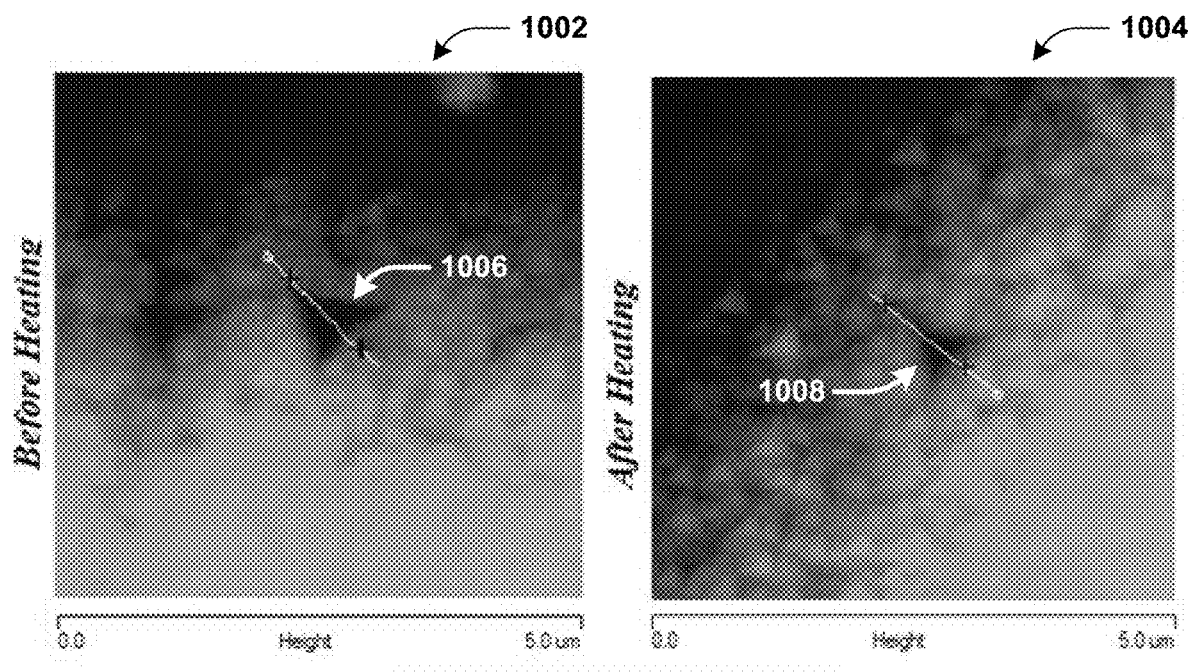
FIG. 10A is an illustration of images associated with a bi-layer thin film being subjected to a fourth nanoindentation process.
Figure 10B:
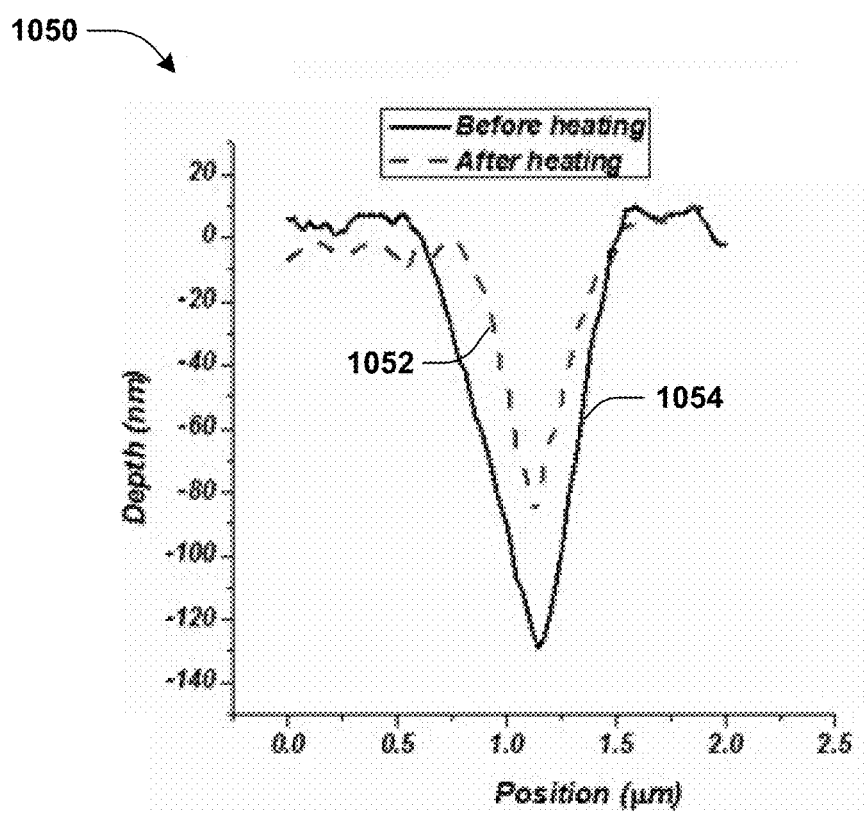
FIG. 10B is an illustration of an indentation depth diagram associated with an indent and a recovered indent.

FIGS. 10A-10B illustrates behavior of the bi-layer thin film subjected to a fourth nanoindentation process. For example, the fourth nanoindentation process may be performed using an indenter. FIG. 10A illustrates images associated with the bi-layer thin film subjected to the fourth nanoindentation process. For example, a first image 1002 comprises a representation of an indent 1006 that occurs once the fourth nanoindentation process is performed. Alternatively and/or additionally, a second image 1004 comprises a representation of a recovered indent 1008 that occurs once the bi-layer thin film undergoes a heating process. For example, the heating process may comprise heating the bi-layer thin film up to a fourth temperature (e.g., the fourth temperature may be equal or greater than the finishing temperature of the austenite phase ($A_f$), such as about 55° C. and/or a different temperature, such as about 50° C., about 60° C., about 65° C., about 45° C., etc.). For example, the heating process may be a part of a heating and cooling cycle comprising the heating process and/or a cooling process, where the bi-layer thin film undergoes the heating process by being heated up to the fourth temperature, then the bi-layer thin film undergoes the cooling process by being cooled down to a fifth temperature (e.g., about 15° C., about 13° C., about 10° C., etc.). For example, as a result of undergoing the heating process (and/or the cooling process), the indent 1006 may change to the recovered indent 1008 due to SME of the bi-layer thin film. The recovered indent 1008 may be shallower (e.g., less deep) than the indent 1006 and/or the recovered indent 1008 may be smaller than the indent 1008. In some examples, the first image 1002 and/or the second image 1004 may be generated using one or more atomic force microscopy (AFM) techniques performed prior to the heating process to generate the first image 1002 and/or performed after the heating process (and/or the cooling process) to generate the second image 1004.

FIG. 10B illustrates an indentation depth diagram 1050 associated with the indent 1006 and the recovered indent 1008. Indentation depth (nanometers) values (e.g., y-axis) are shown as a function of position (micrometers) values associated with the bi-layer thin film (e.g., x-axis). For example, the indentation depth diagram 1050 may comprise a first indentation curve 1054 corresponding to the indent 1006 and/or a second indentation curve 1052 corresponding to the recovered indent 1008. In some examples, a recovery ratio associated with the SME of the bi-layer thin film changing the indent 1006 to the recovered indent 1008 during the heating process may be determined using equation 3:

$$R = \frac{D_{bh} - D_{ah}}{D_{bh}}.$$

In the equation 3, R may be the recovery ratio, $D_{bh}$ may be a first indent depth before the heating process (associated with the indent 1006) and/or $D_{ah}$ may be a second indent depth after the heating process (associated with the recovered indent 1008). For example, the recovery ratio of the bi-layer thin film may be determined to be about 0.33 (and/or a different value, such as a value between 0.25 to 0.40).

Figure 11A:
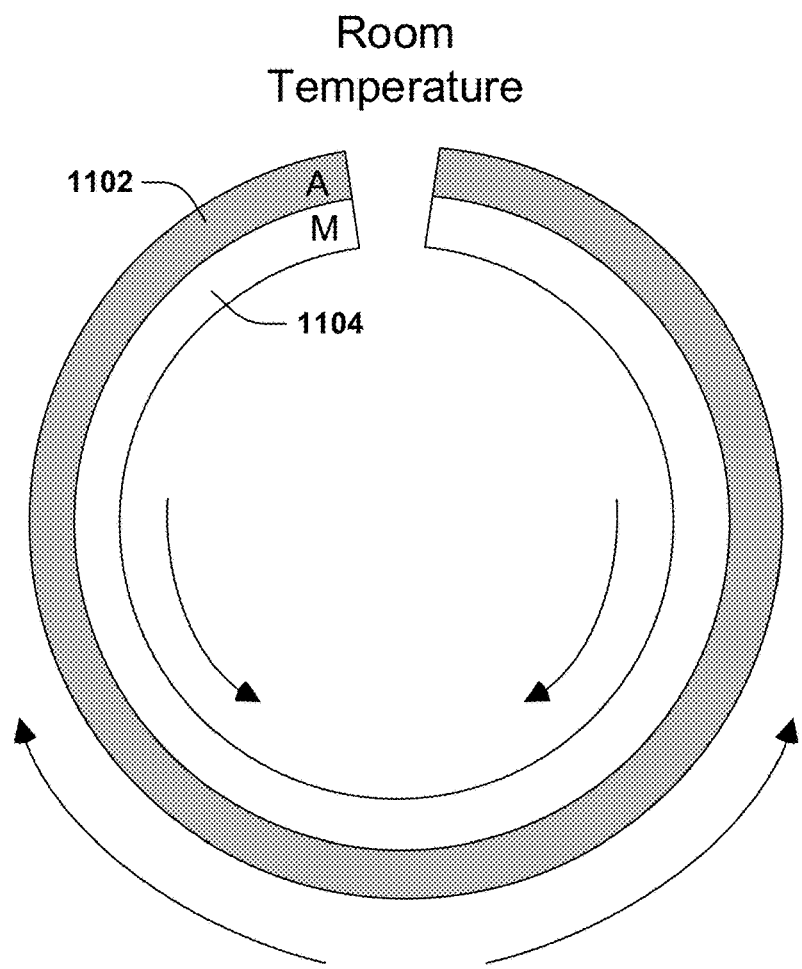
FIG. 11A is an illustration of a first state of a bi-layer thin film.
Figure 11B:
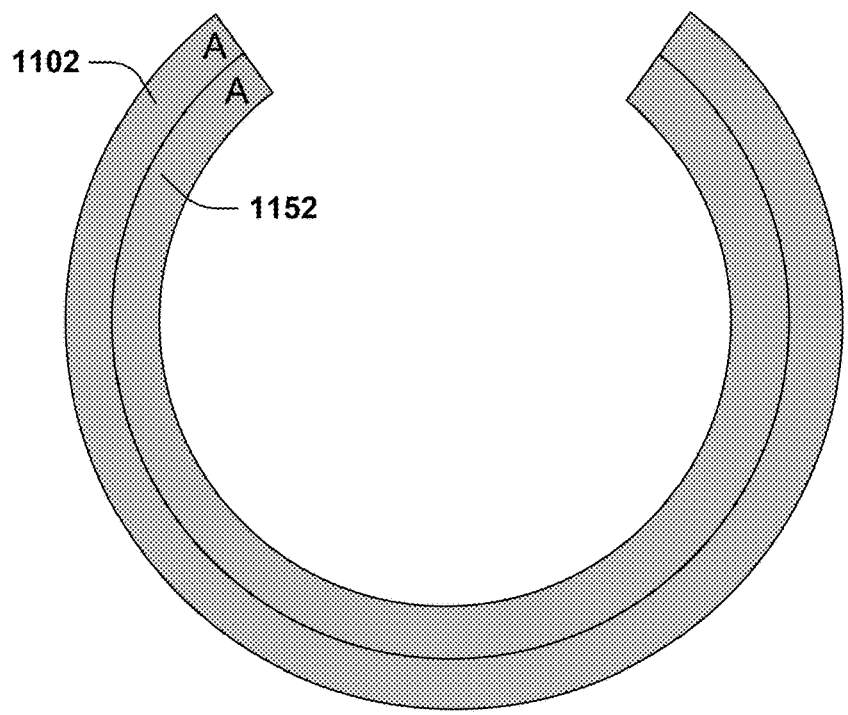
FIG. 11B is an illustration of a second state of a bi-layer thin film.
Figure 11C:
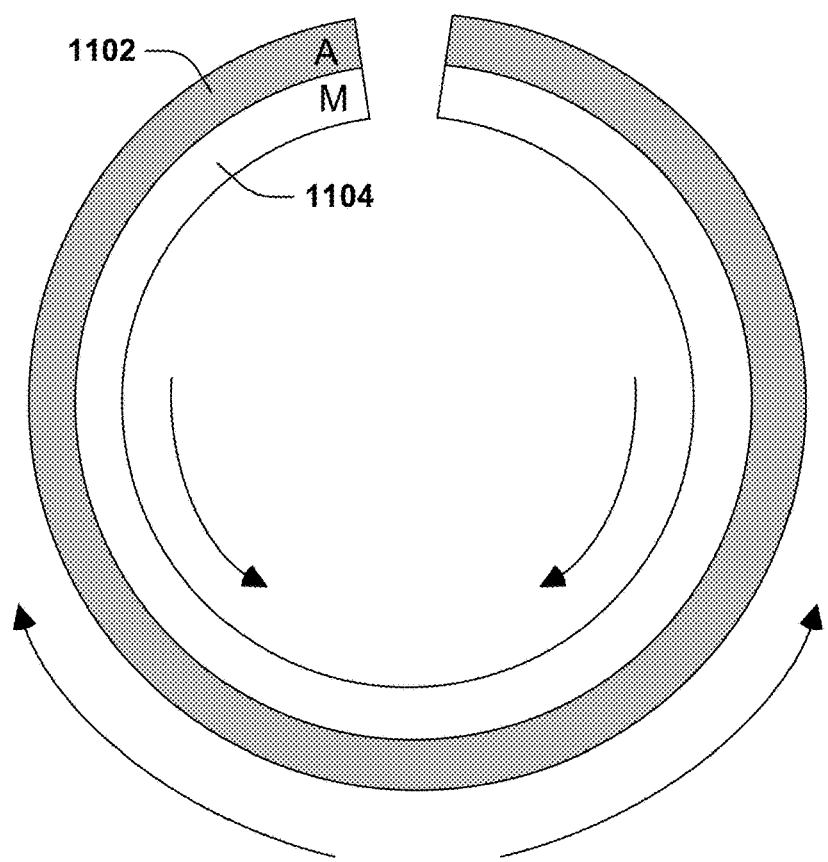
FIG. 11C is an illustration of a third state of a bi-layer thin film.

FIGS. 11A-11C illustrate two-way SME behaviors of the bi-layer thin film. FIG. 11A illustrates a first state 1100 of the bi-layer thin film. For example, a temperature associated with the bi-layer thin film may be about room temperature (e.g., between 20° C. and 25° C.). The bi-layer thin film may comprise a first austenitic structure 1102 (corresponding to the first layer (e.g., the Ni-rich layer)) and/or a first martensitic structure 1104 (corresponding to the second layer (e.g., the Ti-rich layer)). For example, during the first state 1100 when the temperature associated with the bi-layer thin film is about room temperature, the bi-layer thin film may be in a rolled position (e.g., the bi-layer thin film may have a rolled-shape), which may be due to the bi-layer thin film having residual stress.

FIG. 11B illustrates a second state 1150 of the bi-layer thin film. For example, the temperature associated with the bi-layer thin film may be equal or greater than the finishing temperature of the austenite phase ($A_f$), such as about 55° C. and/or a different temperature, such as about 50° C., about 60° C., about 65° C., about 45° C., etc.). For example, the bi-layer thin film may be in the second state 1150 as a result of undergoing merely the heating process of the heating and cooling cycle. In some examples, the first martensitic structure 1104 of the second layer may be changed to a second austenitic structure 1152 of the second layer (as a result of the bi-layer thin film undergoing the heating process). In some examples, the bi-layer thin film may unroll during the heating process (which may be due to the two-way SME behavior of the bi-layer thin film). For example, the bi-layer thin film may unroll during the heating process as a result of the second austenitic structure 1152 of the second layer being formed. Alternatively and/or additionally, the bi-layer thin film may unroll during the heating process because the residual stress of the bi-layer thin film may be overcome by the second layer having the second austenitic structure 1152. In some examples, in the second state 1150, the bi-layer thin film may be in an unrolled position (e.g., the bi-layer thin film may have an unrolled-shape).

FIG. 11C illustrates a third state 1175 of the bi-layer thin film. For example, the temperature associated with the bi-layer thin film may be about room temperature. For example, the bi-layer thin film may be in the third state 1175 as a result of undergoing the cooling process of the heating and cooling cycle. In some examples, the third state 1175 may be the same as the first state 1100. For example, the bi-layer thin film may revert back to the first state 1100 as a result of undergoing the cooling process of the heating and cooling cycle. In some examples, the second austenitic structure 1152 of the second layer may be changed to the first martensitic structure 1102 of the second layer (as a result of the bi-layer thin film undergoing the cooling process). In some examples, the bi-layer thin film may roll during the cooling process (which may be due to the two-way SME behavior of the bi-layer thin film) and/or the third state 1175 may be similar to the first state 1100.

The two-way SME behavior of the bi-layer thin film may not be generated by special thermo-mechanical training procedures used in some thin films. The two-way SME behavior of the bi-layer thin film may be a result of the bi-layer thin film having the residual stress. Alternatively and/or additionally, the two-way SME behavior of the bi-layer thin film may be a result of the bi-layer thin film having slight gradiation throughout the first layer and/or the second layer. Alternatively and/or additionally, the two-way SME behavior of the bi-layer thin film may be a result of the composition gradient across the bi-layer thin film.

It may be appreciated that the two-way SME behavior of the bi-layer thin film may be exhibited while the first layer and/or the second layer are attached to the substrate, if the substrate is made of poly (4,4'-oxydiphenylene-pyromellitimide) (e.g., Kapton™) and/or a different material having a level of flexibility higher than a threshold level of flexibility. Alternatively and/or additionally, in some instances, where the substrate is made of silicone and/or a different material that has a level of flexibility less than the threshold level of flexibility, the two-way SME behavior of the bi-layer thin film and/or rolling and/or unrolling of the bi-layer thin film may occur if the first layer and/or the second layer are detached from the substrate.

In some examples, the bi-layer thin film changing from the first state 1100 to the second state 1150 and then reverting back to the first state 1100 (e.g., the third state 1175), may be associated with a complete heating and cooling cycle. In some examples, the bi-layer thin film may undergo around 10,000 heating and cooling cycles without becoming unstable.

The bi-layer thin film may lead to benefits including improved properties, such as SME, two-way SME behaviors, pseudo elasticity, super elasticity, temperature hysteresis (e.g., thermal hysteresis, transformation hysteresis, etc.), etc. Alternatively and/or additionally, the bi-layer thin film may lead to benefits including reducing a level of complexity required to implement the bi-layer thin film in applications (e.g., complex heat treatment processes and/or training processes may not need to be implemented). Applications of the bi-layer thin film may comprise development of thin film micro-actuators, where an efficiency of applying the bi-layer thin film in thin film micro-actuators may be higher than some other types of thin films, a reliability of applying the bi-layer thin film in thin film micro-actuators may be higher than some other types of thin films, a level of complexity in applying the bi-layer thin film in thin film micro-actuators may be less than some other types of thin films, etc. Alternatively and/or additionally, applications of the bi-layer thin film may comprise development of micro-electromechanical systems (MEMS). Further, (e.g., chemical compositions of) the bi-layer thin film may comprise low-cost elements and/or materials and may not comprise (e.g., a substantial amount of) high-cost elements and/or materials.

Unless specified otherwise, "first," "second," and/or the like are not intended to imply a temporal aspect, a spatial aspect, an ordering, etc. Rather, such terms are merely used as identifiers, names, etc. for features, elements, items, etc. For example, a first object and a second object generally correspond to object A and object B or two different or two identical objects or the same object.

Moreover, "example" is used herein to mean serving as an instance, illustration, etc., and not necessarily as advantageous. As used herein, "or" is intended to mean an inclusive "or" rather than an exclusive "or". In addition, "a" and "an" as used in this application are generally be construed to mean "one or more" unless specified otherwise or clear from context to be directed to a singular form. Also, at least one of A and B and/or the like generally means A or B or both A and B. Furthermore, to the extent that "includes", "having", "has", "with", and/or variants thereof are used in either the detailed description or the claims, such terms are intended to be inclusive in a manner similar to the term "comprising".

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing at least some of the claims.

Various operations of embodiments and/or examples are provided herein. The order in which some or all of the operations are described herein should not be construed as to imply that these operations are necessarily order dependent. Alternative ordering will be appreciated by one skilled in the art having the benefit of this description. Further, it will be understood that not all operations are necessarily present in each embodiment and/or example provided herein. Also, it will be understood that not all operations are necessary in some embodiments and/or examples.

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A method for fabricating a bi-layer thin film, comprising:
   performing vacuum arc re-melting (VAR) using a third alloy to produce a first alloy target;
   performing a first sputtering process to deposit a first alloy onto a substrate using the first alloy target to form a first layer of the bi-layer thin film, wherein:
      the performing the first sputtering process to deposit the first alloy onto the substrate is performed using a first base pressure, wherein the first base pressure is less than $10^{-7}$ millibars;
      the performing the first sputtering process to deposit the first alloy onto the substrate is performed using a first argon pressure, wherein the first argon pressure is about $3 \times 10^{-3}$ millibars;
      the performing the first sputtering process to deposit the first alloy onto the substrate is performed using a first target-substrate distance, wherein the first target-substrate distance is about 50 millimeters;
      the performing the first sputtering process to deposit the first alloy onto the substrate is performed using a first power, wherein the first power is about 200 watts;
      the first layer comprises titanium (Ti) present at a first atomic % within a range of 50.95 to 51.05 atomic %;
      the first alloy target comprises titanium present at an atomic % greater than the first atomic %;
      the first layer comprises nickel (Ni) present at 48.95 to 49.05 atomic %;
      the first layer has a thickness of about 1 micrometer;
      the substrate is made of poly (4,4'-oxydiphenylene-pyromellitimide);
      the substrate has a thickness of about 25 micrometers;
      the depositing the first alloy onto the substrate is performed at a first temperature; and
      the first temperature is between 20° C. and 25° C.;
   performing VAR using a fourth alloy to produce a second alloy target;
   performing a second sputtering process to deposit a second alloy onto the first layer using the second alloy target to form a second layer of the bi-layer thin film, wherein:

the performing the second sputtering process to deposit the second alloy onto the first layer is performed using a second base pressure, wherein the second base pressure is less than $10^{-7}$ millibars;

the performing the second sputtering process to deposit the second alloy onto the first layer is performed using a second argon pressure, wherein the second argon pressure is about $3\times10^{-3}$ millibars;

the performing the second sputtering process to deposit the second alloy onto the first layer is performed using a second target-substrate distance, wherein the second target-substrate distance is about 50 millimeters;

the performing the second sputtering process to deposit the second alloy onto the first layer is performed using a second power, wherein the second power is about 200 watts;

the second layer comprises titanium present at a second atomic % within a range of 49.15 to 49.25 atomic %;

the second alloy target comprises titanium present at an atomic % greater than the second atomic %;

the second layer comprises nickel present at 50.75 to 50.85 atomic %;

the second layer has a thickness of about 1 micrometer;

the depositing the second alloy onto the first layer is performed at a second temperature; and the second temperature is between 20° C. and 25° C.;

responsive to performing the second sputtering process to deposit the second alloy onto the first layer:
annealing the bi-layer thin film in a chamber at a heating rate of about 10° C./minute and at a base pressure of less than $10^{-7}$ millibars; and
generating, using a turbo molecular vacuum pump, a vacuum in the chamber within which the bi-layer thin film is annealed, wherein the bi-layer thin film comprises the substrate, the first layer and the second layer;

responsive to at least one of a temperature of the bi-layer thin film reaching a third temperature or a temperature of an atmosphere surrounding the bi-layer thin film reaching the third temperature, maintaining the third temperature for a specified duration of time, wherein the third temperature is between 465° C. and 500° C. and the specified duration of time is between 30 to 60 minutes; and responsive to completion of the specified duration of time, lowering at least one of the temperature of the bi-layer thin film or the temperature of the atmosphere surrounding the bi-layer thin film at a cooling rate until at least one of the temperature of the bi-layer thin film or the temperature of the atmosphere surrounding the bi-layer thin film are between 20° C. and 25° C.

2. The method of claim 1, wherein:
the first sputtering process is a first direct current (DC) magnetron sputtering process; and
the second sputtering process is a second DC magnetron sputtering process.

3. The method of claim 2, comprising:
during the performing the first sputtering process to deposit the first alloy onto the substrate using the first alloy target, rotating an object upon which the substrate is mounted such that a first uniform distribution of composition associated with the first layer is achieved; and
during the performing the second sputtering process to deposit the second alloy onto the first layer using the second alloy target, rotating the object such that a second uniform distribution of composition associated with the second layer is achieved.

4. The method of claim 3, wherein the bi-layer thin film exhibits:
pseudo elasticity; and
shape memory effect (SME).

5. The method of claim 4, wherein:
the cooling rate is about 10° C./minute.

6. A method for fabricating a bi-layer thin film, comprising:
performing vacuum arc re-melting (VAR) using a third alloy to produce a first alloy target;

performing a first sputtering process to deposit a first alloy onto a substrate using the first alloy target to form a first layer of the bi-layer thin film, wherein:
the first layer comprises nickel (Ni) present at 50.75 to 50.85 atomic %;
the first layer comprises titanium (Ti) present at a first atomic % within a range of 49.15 to 49.25 atomic %;
the first alloy target comprises titanium present at an atomic % greater than the first atomic %;
the first layer has a thickness of about 1 micrometer;
the substrate is made of a polymer material;
the substrate has a thickness of about 25 micrometers;
the depositing the first alloy onto the substrate is performed at a first temperature; and
the first temperature is between 20° C. and 25° C.;

performing VAR using a fourth alloy to produce a second alloy target;

performing a second sputtering process to deposit a second alloy onto the first layer using the second alloy target to form a second layer of the bi-layer thin film, wherein:
the second layer comprises titanium present at a second atomic % within a range of 50.95 to 51.05 atomic %;
the second alloy target comprises titanium present at an atomic % greater than the second atomic %;
the second layer comprises nickel present at 48.95 to 49.05 atomic %;
the second layer has a thickness of about 1 micrometer;
the depositing the second alloy onto the first layer is performed at a second temperature; and
the second temperature is between 20° C. and 25° C.;

responsive to performing the second sputtering process to deposit the second alloy onto the first layer:
annealing the bi-layer thin film in a chamber at a heating rate of about 10° C./minute and at a base pressure of less than $10^{-7}$ millibars; and
generating, using a turbo molecular vacuum pump, a vacuum in the chamber within which the bi-layer thin film is annealed, wherein the bi-layer thin film comprises the substrate, the first layer and the second layer;

responsive to at least one of a temperature of the bi-layer thin film reaching a third temperature or a temperature of an atmosphere surrounding the bi-layer thin film reaching the third temperature, maintaining the third temperature for a specified duration of time, wherein the third temperature is between 465° C. and 500° C. and the specified duration of time is between 30 to 60 minutes; and responsive to completion of the specified duration of time, lowering at least one of the temperature of the bi-layer thin film or the temperature of the atmosphere surrounding the bi-layer thin film at a cooling rate of about 10° C./minute until at least one of the temperature of the bi-layer thin film or the temperature of the atmosphere surrounding the bi-layer thin film are between 20° C. and 25° C.

7. The method of claim 6, wherein:

the first sputtering process is a first direct current (DC) magnetron sputtering process; and the second sputtering process is a second DC magnetron sputtering process.

8. The method of claim 7, wherein:

the performing the first sputtering process to deposit the first alloy onto the substrate is performed using a first base pressure, wherein the first base pressure is less than $10^{-7}$ millibars;

the performing the first sputtering process to deposit the first alloy onto the substrate is performed using a first argon pressure, wherein the first argon pressure is about $3 \times 10^{-3}$ millibars;

the performing the first sputtering process to deposit the first alloy onto the substrate is performed using a first target-substrate distance, wherein the first target-substrate distance is about 50 millimeters;

the performing the first sputtering process to deposit the first alloy onto the substrate is performed using a first power, wherein the first power is about 200 watts;

the performing the second sputtering process to deposit the second alloy onto the first layer is performed using a second base pressure, wherein the second base pressure is less than $10^{-7}$ millibars;

the performing the second sputtering process to deposit the second alloy onto the first layer is performed using a second argon pressure, wherein the second argon pressure is about $3 \times 10^{-3}$ millibars;

the performing the second sputtering process to deposit the second alloy onto the first layer is performed using a second target-substrate distance, wherein the second target-substrate distance is about 50 millimeters; and the performing the second sputtering process to deposit the second alloy onto the first layer is performed using a second power, wherein the second power is about 200 watts.

9. The method of claim 8, wherein the polymer material of the substrate is poly (4,4'-oxydiphenylene-pyromellitimide).

* * * * *